(12) United States Patent
Sareen et al.

(10) Patent No.: US 8,901,974 B2
(45) Date of Patent: Dec. 2, 2014

(54) PHASE LOCKED LOOP AND METHOD FOR OPERATING THE SAME

(71) Applicant: Texas Instruments Deutschland GmbH, Freising (DE)

(72) Inventors: Puneet Sareen, Freising (DE); Markus Dietl, Munich (DE); Ketan Dewan, Freising (DE); Edmond F. George, Kerala (IN)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 13/754,168

(22) Filed: Jan. 30, 2013

(65) Prior Publication Data

US 2014/0210529 A1 Jul. 31, 2014

(51) Int. Cl.
*H03L 7/06* (2006.01)
*H03L 7/089* (2006.01)

(52) U.S. Cl.
CPC .................................. *H03L 7/0893* (2013.01)
USPC ........... 327/156; 327/157; 327/158; 375/374; 375/375; 375/376; 331/17

(58) Field of Classification Search
USPC .......... 327/156, 157, 158; 375/374, 375, 376; 331/17
See application file for complete search history.

(56) References Cited

U.S. PATENT DOCUMENTS

| 5,166,642 | A | 11/1992 | Hietala |
| 6,107,843 | A | 8/2000 | de Gouy et al. |
| 7,292,119 | B2 | 11/2007 | Urakawa |
| 8,373,465 | B1 * | 2/2013 | Sareen et al. ................. 327/156 |

FOREIGN PATENT DOCUMENTS

| DE | 102010048584 | 4/2012 |
| WO | WO 2004021559 | 3/2004 |

OTHER PUBLICATIONS

EP Application No. 11183369.5—Electronic Device and Method for Phase Locked Loop.

* cited by examiner

*Primary Examiner* — John Poos
(74) *Attorney, Agent, or Firm* — Alan A. R. Cooper; Frederick J. Telecky, Jr.

(57) ABSTRACT

The invention generally relates to phase locked loops (PLL), and more specifically to ultra-low bandwidth phase locked loops. The invention may be for example embodied in an integrated circuit implementing a phase locked loop or a method for operating a phase locked loop. The invention provides a PLL with a control stage that uses only two storage cells, a counter and a digital-to-analog (DAC) converter. In comparison to prior-art PLLs using storage cells the configuration of the invention's control stage reduces the chip area required for the PLL reduced. The invention further suggests PVT compensation mechanisms for a PLL and implementing a PLL that has lower peaking in its frequency response, which results in better settling response.

20 Claims, 21 Drawing Sheets

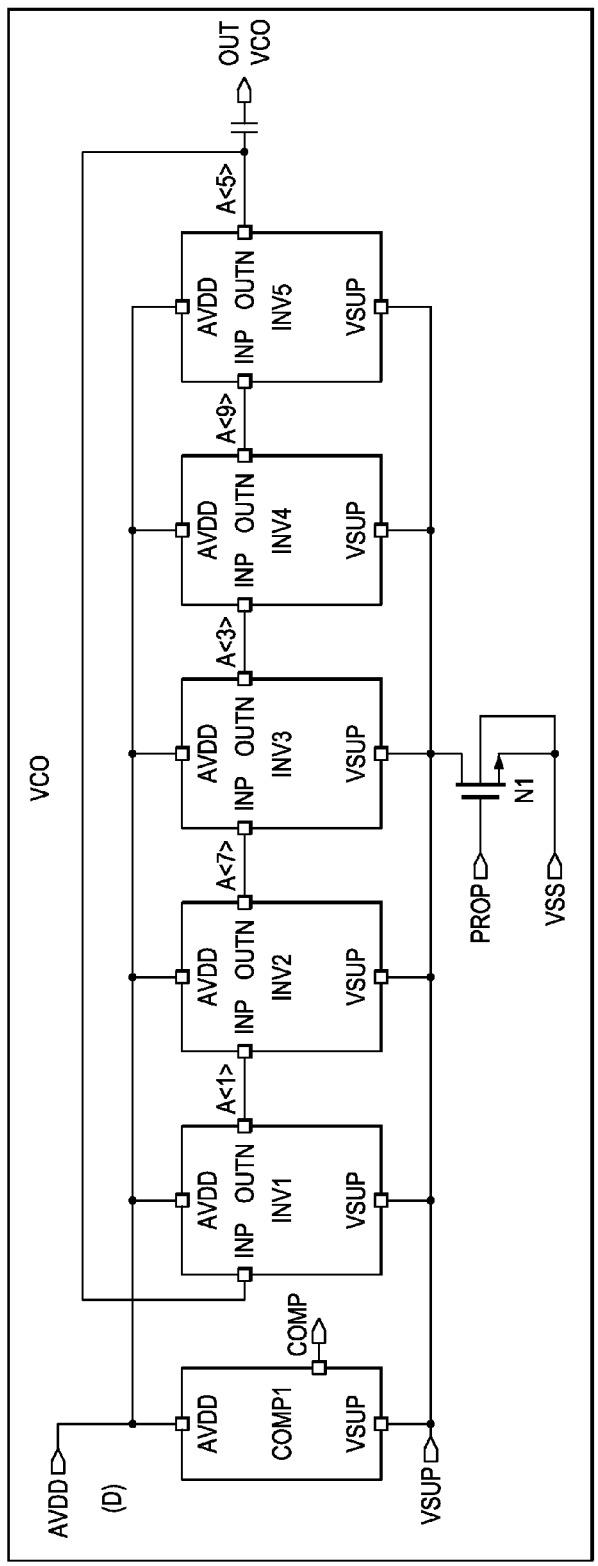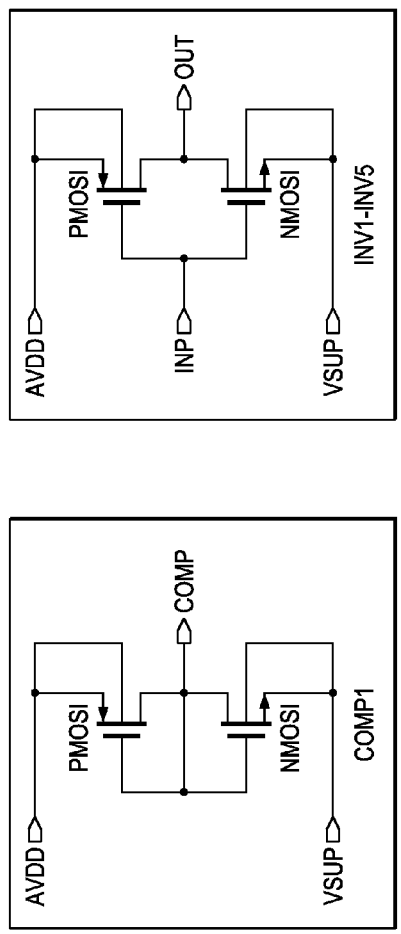
FIG. 14

PHASE LOCKED LOOP AND METHOD FOR OPERATING THE SAME

TECHNICAL FIELD

The invention generally relates to phase locked loops (PLL), and more specifically to ultra-low bandwidth phase locked loops. The invention may be for example embodied in an integrated circuit implementing a phase locked loop or a method for operating a phase locked loop. The integrated circuit implementing the phase locked loop could be for example part of an electronic device.

TECHNICAL BACKGROUND

Phase locked loops are typically equipped with controlled oscillators, for example a voltage controlled oscillator (VCO). The VCO is coupled in a feedback loop in order to generate a high frequency clock from a low frequency reference clock. This reference clock is of a lower frequency since it is easier to generate various stable and precise clock signals at lower frequencies. An example of a phase locked loop according to the prior art is shown in FIG. 1. There is a VCO, a phase frequency detector PFD, a charge pump, a divider DIV and a compensation capacitor C1, an integrating analog element including a resistor R and a capacitor C2. The phase frequency detector PFD compares the phase of the reference clock REFCKL with the phase of the feedback clock signal SYSCLK which have basically the same clock frequency. The feedback clock signal SYSCLK is the clock signal PLL-OUT output by the PLL and divided by the divider DIV. If the frequency or the phase of the feedback clock signal SYSCLK differs from the phase or frequency of the reference clock signal REFCLK, the charge pump CP applies a signal to the VCO in order to increase or decrease the phase or frequency of the output signal PLLOUT of the VCO. The signal ICH issued by the charge pump is a function of the difference between the reference clock REFCLK and the feedback clock signal SYSCLK.

The VCO may be implemented as a ring oscillator. The ring oscillator topology provides a series of cascaded delay stages (typically inverters). The output signal from the last delay stage is fed back to the input of the first delay stage. The total delay through the cascaded stages (including any net inversion of the signal within the system) is designed to satisfy criteria for sustained oscillation. Typically each delay stage has a variable delay governed by an independent input. The oscillation frequency of the VCO is then controlled by the input signal in order to vary the stage delay. The oscillation frequency for a ring oscillator can be tuned over a wide range, as for example 20% to 50% of the nominal center frequency of the VCO.

In order to comply with very low frequency of REFCLK signal, the PLL has to have a very low bandwidth. PLLs with such low bandwidths require external components (such as large capacitors) and also consume a lot of power. However, integrated circuits used in handheld and mobile devices require low power consumption and less number of external components while using as less chip area as possible. An alternate approach to implement such a low bandwidth PLL is for example described in the published German patent application DE 10 2010 048 584 and European patent application EP 11 183 369.5 filed Sep. 29, 2011 by the same applicant. In the latter patent application, the PLL described in this document uses semi-digital storage cells where a set of N number of semi-digital storage cells and 4 capacitors replace the loop filter capacitor C using much less chip area.

SUMMARY

It is another general object of the invention to provide a low-bandwidth PLL that can be built on a relatively small die. It is another general object of the invention to provide a PLL that requires less external components and consumes less power than PLLs according to the prior art. A further general object of the invention is to provide a low-bandwidth PLL that has lower peaking. Another object of the invention is to provide a better process compensation for a PLL.

In a first aspect of the invention, a PLL is provided with a control stage that uses only two storage cells, a counter and a digital-to-analog (DAC) converter. In comparison to a PLL as for example described in European patent application EP 11 183 369.5 or published German patent application DE 10 2010 048 584 this configuration of the PLL's control stage reduces the chip area required for the PLL further, since the number of capacitors as well as the number of storage cells can be reduced. In example implementations using only two storage cells (and two storage capacitances), and in comparison to the example described in European patent application EP 11 183 369.5, where the storage cells share four capacitances, the reduction of the components in the control stage of the PLL may account for a reduction of 20% in the overall chip area.

In another, second aspect of the invention, an improved process-voltage-temperature (PVT) compensation technique for the PLL is suggested. In this aspect the current consumed by the controlled oscillator VCO is used as an indication of the operating point (process, voltage and temperature) of the phase locked loop, respectively, the chip/integrated circuit (IC) comprising the same. The controlled oscillator VCO's output current is mirrored to be used in the charge pump current. This way for a chip/integrated circuit in weak PVT condition the controlled oscillator VCO uses more current to oscillate at the target frequency and the charge pump current is increased by the same proportion based on the controlled oscillator VCO output current. Similarly for a chip/integrated circuit in strong PVT corner, the controlled oscillator VCO current consumption is lowered, reflecting proportional decrease in charge pump current. Thus the PLL may thus be self-compensated and may provide constant bandwidth across various PVT conditions. In implementations using two charge pumps, as for example in the first aspect of the invention, the controlled oscillator VCO output current may be fed back to both charge pumps for PVT compensation. This second aspect of the invention can be readily combined with the first aspect of the invention.

A further, third aspect of the invention, which can be readily combined with the two before-mentioned aspects, allows implementing a PLL that has lower peaking in its frequency response, which results in better settling response. The frequency response peaking may be for example lowered by reducing the integral path gain of the PLL. In a semi digital architecture, as for example described in European patent application EP 11 183 369.5 or published German patent application DE 10 2010 048 584, or a PLL in line with the first aspect of the invention, this can be achieved by increasing the time to charge or discharge the storage cells' capacitors. To increase the storage cell charging/discharging time, either the charge pump current may be reduced or the storage cell capacitor size may be increased. In some applications, decreasing the charge pump current may not be desirable from a reliability perspective, since typically the charge pump current is already very low (e.g. in the one digit nA (nano Ampere) range, e.g. 1 nA). Increasing the area of the storage cells' capacitors will increase the area of the chip. Therefore, according to another exemplary implementation, it is proposed to sample the current through the integral path that charges the storage capacitor using a high speed clock signal, which may be for example in the GHz range (e.g. 1 GHz or higher). The duty cycle of the clock may be for example set to be less than 25% such that the storage capacitor is allowed to charge or discharge only 25% of the time. A duty ratio of 25% may decrease the effective charging current by a factor of 4, and may increase the charging time by the same amount, which can result in a reduced frequency peaking of the loop.

An exemplary embodiment of the first aspect provides a phase locked loop. The phase locked loop comprises a phase frequency detector that receives a feedback clock (or system clock signal) and a reference clock. The phase frequency detector provides UP pulses and DOWN pulses for controlling the oscillation frequency of a controlled oscillator in response to a phase and/or frequency difference between the feedback clock and the reference clock. The phase locked loop further comprises a first charge pump that receives the UP pulses and DOWN pulses from the phase frequency detector. The first charge pump may provide a first analog control signal to a first control input of the controlled oscillator to control its oscillation frequency in response to the UP pulses and DOWN pulses from the phase frequency detector.

The phase locked loop further comprises a second charge pump. The second charge pump receives the UP pulses and DOWN pulses from the phase frequency detector. The second charge pump may provide a first analog storage control signal and a second analog storage control signal corresponding to the UP pulses and DOWN pulses from the phase frequency detector to a control stage. The control stage of the phase locked loop provides a second analog control signal to a second control input of the controlled oscillator to control its oscillation frequency in response to the first analog storage control signal and a second analog storage control signal.

The controlled oscillator outputs an output signal with a desired oscillation frequency in response to the first analog control signal received at the first control input and the second analog control signal to the second control input. The phase locked loop further comprises a feedback loop to feed back the output signal of the controlled oscillator—or alternatively a level shifted version thereof—to the input of the phase frequency detector as the feedback clock signal.

According to this embodiment, the control stage comprises a plurality of storage elements, a counter, and a digital-to-analog converter. The control stage may continuously charge and reset, or discharge and reset each of the storage elements (in respective cycles and) in response to the first analog storage control signal and a second analog storage control signal, respectively. In one exemplary implementation of this embodiment there are two storage elements, but in general, also more storage elements may be provided.

The counter is adapted to increase or decrease its counter value in response to the number of charging cycles or discharging cycles performed by the storage elements, respectively. The digital-to-analog converter converts the counter value of the counter to a control current. The control stage provides the control current of the digital-to-analog converter superimposed with currents representing the respective charging/discharging state of the respective storage elements as the second analog control signal to the second control input to the controlled oscillator.

In the phase locked loop of another exemplary embodiment, each of the storage elements comprises a capacitor. The capacitor of each storage element that is charged or discharged in response to the first analog storage control signal and a second analog storage control signal. The current representing the respective charging/discharging state of a respective one of the storage elements may be for example representative of the current stored on the respective capacitor of the storage element.

Furthermore, in another exemplary implementation, each of the storage elements provides an output signal as an input signal to the respective other storage element. Asserting the output signal by one of the storage elements causes the other storage element (receiving the output signal as an input signal) to enable charging or discharging its capacitor. In one embodiment, the storage element will be enabled only when the signal on its input is logic high, and will be disabled when the signal on its input is logic low. Enabled means that the storage element can charge or discharge its capacitor in response to the first analog storage control signal and a second analog storage control signal. Disabled means that the storage element cannot charge or discharge its capacitor. In one exemplary embodiment, the output signal is asserted by a storage element, when the voltage across its capacitor is crosses the mid potential threshold level (see below).

Without losing generality, in another exemplary implementation of the phase locked loop, there is a low potential threshold level, a high potential threshold level and mid potential threshold level between the low potential threshold level and the high potential threshold level. A respective storage element may assert the output signal when its capacitor is charged or discharged to the mid potential threshold level. In one example implementation, the low potential threshold level is equal to ¼ of a predetermined potential (e.g. VDD), the high potential threshold level ¾ of the predetermined potential and the mid potential threshold level is equal to ½ of the predetermined potential. The predetermined potential may be for example the rail voltage provided to the phase locked loop. This may be for example the rail voltage provided on the circuit board or the integrated circuit on/in which the phase locked loop is implemented. In another exemplary implementation the predetermined potential could also be the potential of the power source of the PLL circuitry, which may or may not be equal to the rail voltage.

Furthermore, in another exemplary implementation, the storage element (continuously) determines whether its capacitor is charged to the high potential threshold level. If the capacitor is charged to the high potential threshold level, the storage element resets the voltage across it capacitor to the low potential threshold level and outputs a clock pulse to the counter to increase its counter value. Likewise, the storage element (continuously) determines whether its capacitor is discharged to the low potential threshold level. If the capacitor is discharged to the low potential threshold level, the storage element resets the voltage across its capacitor to the high potential threshold level and outputs a clock pulse to the counter to decrease its counter value.

In an exemplary implementation, the monitoring of the potential threshold levels may be for example realized by means of comparators. One input of the comparator is coupled to a node (potential) indicative of the voltage across the storage capacitor of the storage element. The second input to the comparator is coupled to a respective one of the potential threshold levels, so that the comparator output will indicate when the potentials on its first and second input are equal to each other.

According to a further exemplary embodiment of the invention, the second charge pump produces the first analog storage control signal and a second analog storage control signal from the UP pulses and DOWN pulses. In one exemplary implementation, second charge pump produces the first analog storage control signal and a second analog storage control signal by lowering the duty cycle of the UP pulses and DOWN pulses to 25% or lower. In another exemplary implementation, in addition to lowering the duty cycle or alternatively thereto, the signal level of the UP pulses and DOWN pulses is equal to a predetermined potential, and the second charge pump produces the first analog storage control signal and a second analog storage control signal by reducing the signal level of the UP pulses and DOWN pulses.

The reduction of the signal level could be for example controlled by means of a variable resistance. The variable resistance may be for example formed by a series-connection of a plurality of pairs of resistors and switches connected in parallel to each other, where the switches control the overall resistance. The switches may be controlled by means of control signals. The controls signals could be for example provided by the controlled oscillator or the control stage.

In one embodiment, the control signals are varied according to the output signal of the controlled oscillator or the control stage to thereby enable process-voltage-temperature compensation of the phase locked loop.

Another exemplary embodiment in line with the second aspect of the invention relates to a phase locked loop. The phase locked loop comprises a phase frequency detector that receives a feedback clock and a reference clock and further provides UP pulses and DOWN pulses for controlling the oscillation frequency of a controlled oscillator in response to a phase and/or frequency difference between the feedback clock and the reference clock. The phase locked loop also comprises a first charge pump that receives the UP pulses and DOWN pulses from the phase frequency detector. The first charge pump provides a first analog control signal to a first control input of a controlled oscillator to control its oscillation frequency in response to the UP pulses and DOWN pulses from the phase frequency detector. The phase locked loop may also comprise a second charge pump that receives the UP pulses and DOWN pulses from the phase frequency detector. The second charge pump provides a first analog storage control signal and a second analog storage control signal corresponding to the UP pulses and DOWN pulses from the phase frequency detector to a control stage. The control stage provides a second analog control signal to a second control input of the controlled oscillator to control its oscillation frequency in response to the first analog storage control signal and a second analog storage control signal.

Furthermore, the controlled oscillator outputs an output signal with a desired oscillation frequency in response to the first analog control signal received at the first control input and the second analog control signal to the second control input. The phase locked loop may also have a feedback loop to couple back to the input of the phase frequency detector the output signal of the controlled oscillator as said feedback clock. The first charge pump and/or the second charge pump may receive the output signal of the controlled oscillator and use the same for process-voltage-temperature compensation.

In another exemplary embodiment, the phase locked loops of the embodiments in line with the aspects of this invention, the first charge pump increases or decreases the amount of current provided by the first analog control signal in response to the output signal of the controlled oscillator.

In the phase locked loop according to a further embodiment, the second charge pump increases or decreases the amount of current provided by the first analog storage control signal and the second analog storage control signal, respectively, in response to the output signal of the controlled oscillator. The amount of current could be for example increased or decreased by increasing or decreasing the pulse width of the first analog storage control signal and the second analog storage control signal, respectively.

As noted above, the phase locked loop according to the various embodiments described herein could be for example implemented by an integrated circuit (IC), by means of a dedicated circuit on a circuit board. Furthermore, the phase locked loop according to the various embodiments described herein could also be part of an electronic device.

Another embodiment of the first aspect of the invention provides a method for operating a phase locked loop. The method may comprise receiving a feedback clock and a reference clock at a phase frequency detector. The method may further comprise providing UP pulses and DOWN pulses for controlling the oscillation frequency of a controlled oscillator in response to a phase and/or frequency difference between the feedback clock and the reference clock and receiving the UP pulses and DOWN pulses at a first charge pump. The method may comprise providing a first analog control signal from the first charge pump to a first control input of a controlled oscillator to control its oscillation frequency.

The method may additionally comprise receiving the UP pulses and DOWN pulses at a second charge pump and providing a first analog storage control signal and a second analog storage control signal corresponding to the UP pulses and DOWN pulses to a control stage. In this method, the control stage may provide a second analog control signal to a second control input of the controlled oscillator to control its oscillation frequency in response to the first analog storage control signal and a second analog storage control signal. The method may further comprise outputting, by said controlled oscillator, an output signal with a desired oscillation frequency in response to the first analog control signal and the second analog control signal to the second control input.

The method may also comprise continuously charging and resetting, or discharging and resetting, storage elements of the control stage in respective cycles and in response to the first analog storage control signal and a second analog storage control signal, respectively; and increasing or decreasing a counter value of a digital counter in response to the number of charging cycles or discharging cycles performed by the storage elements, respectively. The method also comprises converting the digital counter value of the counter to a control current; superimposing the control current with currents representing the respective charging/discharging state of the respective two storage elements; and providing the superimposed current as the second analog control signal to the second control input to the controlled oscillator.

A further embodiment of the second aspect of the invention provides a method for operating a phase locked loop. The method may comprise receiving a feedback clock and a reference clock at a phase frequency detector and providing UP pulses and DOWN pulses for controlling the oscillation frequency of a controlled oscillator in response to a phase and/or frequency difference between the feedback clock and the reference clock. The UP pulses and DOWN pulses may be received at a first charge pump, which provides a first analog control signal from the first charge pump to a first control input of a controlled oscillator to control its oscillation frequency. Further according to the method, the UP pulses and DOWN pulses may be received at a second charge pump. The method may also comprise providing a first analog storage control signal and a second analog storage control signal corresponding to the UP pulses and DOWN pulses to a control stage; and providing by said control stage a second analog control signal to a second control input of the controlled oscillator to control its oscillation frequency in response to the first analog storage control signal and a second analog storage control signal. According to the method, the controlled oscillator may output an output signal with a desired oscillation frequency in response to the first analog control signal and the second analog control signal to the second control input.

The method may also comprise receiving the output signal of the controlled oscillator at the first charge pump and/or the second charge pump and using the output signal of the controlled oscillator for process-voltage-temperature compensation.

BRIEF DESCRIPTION OF THE DRAWINGS

For a more complete understanding of the present invention, and the advantages thereof, reference is now made to the following descriptions taken in conjunction with the accompanying drawings, in which:

FIG. 14 shows a circuit diagram of the controlled oscillator according to another exemplary embodiment of the invention.

DETAILED DESCRIPTION

The invention generally relates to phase locked loops, and more specifically to low-bandwidth or ultra-low bandwidth phase locked loops. Low-bandwidth PLL may for example refer to a PLL having a bandwidth of 100 Hz to 1 kHz. An ultra-low bandwidth PLL may be for example a PLL having a lower bandwidth than a low-bandwidth PLL, which could be for example in the 1 Hz range or even lower. The invention may be for example embodied in an integrated circuit implementing a phase locked loop or in a circuit board, e.g. a printed circuit board providing a discrete implementation of the PLL. The invention could also be embodied in an electronic device or a method for operating a phase locked loop.

Figure 1:
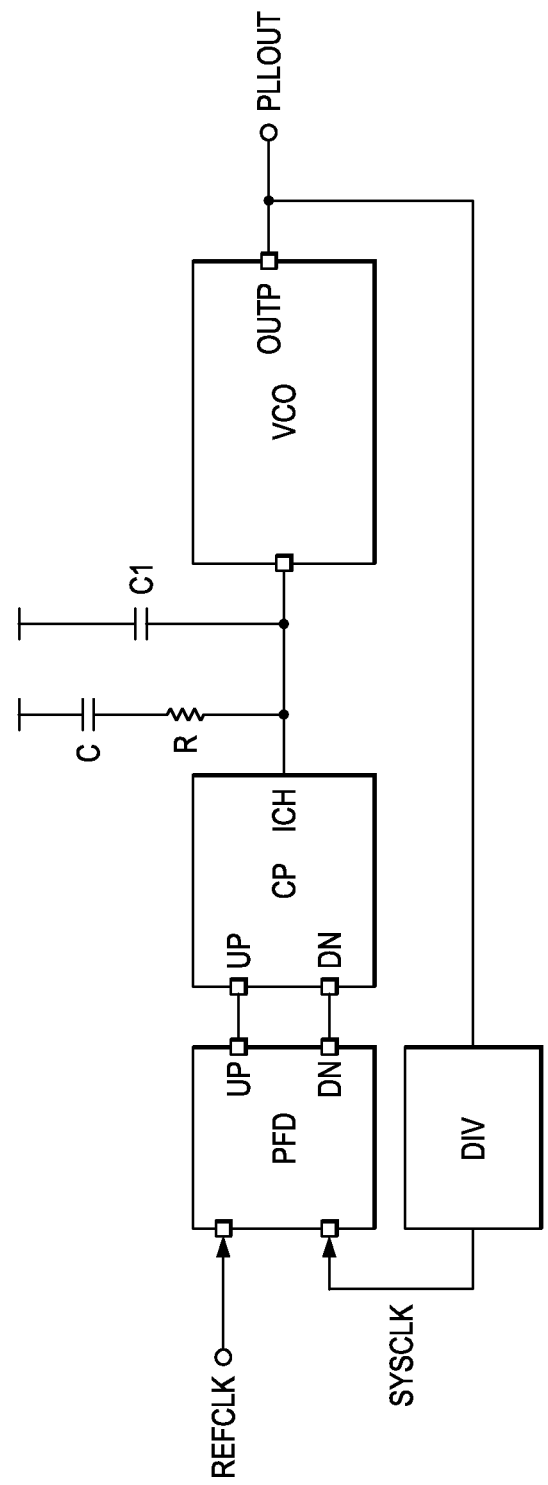
FIG. 1 shows a conventional architecture of PLL.
Figure 2:
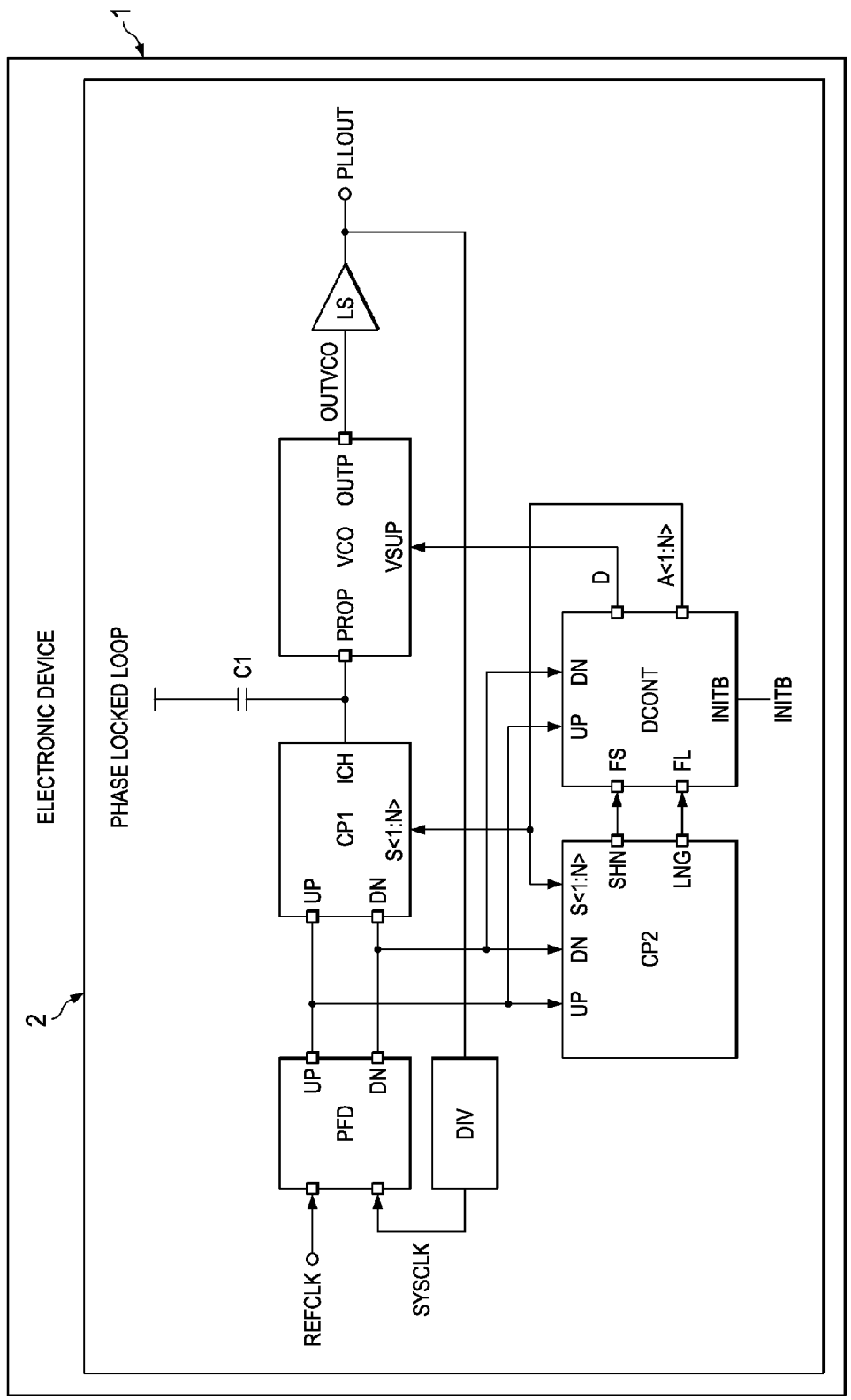
FIG. 2 shows a simplified block diagram of an electronic device comprising a PLL according to an exemplary embodiment of the invention.

FIG. 2 shows an electronic device 1 including a PLL 2 in accordance with an exemplary embodiment of the invention. The PLL 2 includes a phase frequency detector PFD, an output of which is coupled to the input of the charge pump CP1. The output may include outputs UP and DN, on which phase frequency detector PFD provides UP pulses and DOWN pulses, depending on the phase and/or frequency offset between the reference clock REFCLK and a system clock SYSCLK received via inputs of phase frequency detector PFD. The pulse width of the respective UP pulses and DOWN pulses is dependent on and/or frequency offset between the reference clock REFCLK and a system clock SYSCLK, as in conventional PLLs. UP pulses are intended to control the controlled oscillator VCO to increase its oscillation frequency, whole DOWN pulses are intended control the controlled oscillator VCO to decrease its oscillation frequency. Phase frequency detector PFD can be a conventional phase frequency detector PFD configured to compare the phase of the reference clock signal REFCLK to the phase of the feedback clock signal SYSCLK.

An output ICH of charge pump CP1 is coupled to a first control input PROP of the controlled oscillator VCO and provides a first analog control signal. Furthermore, the PLL 2 may include a loop filter capacitor C1. The output ICH of charge pump CP1 is may be coupled to one side of loop filter capacitor C1. The other side of capacitor C1 may be coupled to ground voltage level or a predetermined potential. The output signal OUTVCO of the controlled oscillator VCO may be optionally coupled to the input of level shifter LS, the output of which is the PLL output signal PLLOUT.

The output signal PLLOUT or output signal OUTVCO is fed back to a divider DIV. Divider DIV divides the frequency of the output signal PLLOUT by a predetermined integer factor and provides the resulting signal as the system clock signal SYSCLK to the phase frequency detector PFD. Another input of phase frequency detector PFD receives the reference clock signal REFCLK, as noted above.

The second charge pump CP2 is coupled to receive the output of phase frequency detector PFD. More specifically, charge pump CP2 receives the UP and DOWN pulses from phase frequency detector PFD at respective inputs UP and DN. The signals SHN and LNG are outputs of the second charge pump and are coupled to the inputs FS and FL of control stage DCONT. Signal FS refers to increasing speed (increasing oscillation frequency of VCO) and signal FL refers to decreasing speed (decreasing frequency of oscillation of VCO). Signals FL and FS may be also referred to as first and second analog storage control signals, as they control the operation of storage elements of the control stage DCONT.

The second charge pump CP2 performs a signal conversion of the UP and DOWN pulses received from the phase frequency detector PFD. For example, the signal levels of the UP and DOWN pulses may be corresponding to the predetermined potential (e.g. supply voltage or rail voltage). In one exemplary embodiment, the second charge pump CP2 produces signals FL and FS, which are copies of the UP and DOWN pulses as concerns their pulse width, but which have a significantly lower level. For example, signals FL and FS may provide a current in the one-digit nA range, e.g. in the range between 0.5 nA to 2 nA, and more specifically, e.g. 1 nA. In addition or optionally to the level conversion, second charge pump CP2 may further reduce the duty ratio of the UP and DOWN pulses, e.g. by sampling them with a high frequency clock signal having a low duty ration, e.g. 25% or less. The clock signal may have a frequency in the GHz range, e.g. 1 GHz or higher. It should be noted that the clock frequency is depending on the bandwidth of PLL 2. In one exemplary embodiment, the bandwidth of PLL 2 is in the one-digit Hz range or lower, e.g. 1 Hz or 0.5 Hz. In this case a clock signal of 1 GHz could be used. If the bandwidth of PLL 2 increases, e.g. in the 100 Hz to 1 kHz range, also the frequency of the clock signal for sampling the UP and DOWN pulses should be increased accordingly.

In a further exemplary embodiment, the charge pump CP2 may be capable of providing a very fine resolution for the UP and DOWN pulses, so that also very small phase or frequency deviations can be reflected. For example, in case there is only a very short UP pulse, the charge pump CP2 may represent the UP pulse by a combination of a first analog storage control pulse FAST and a second analog storage control pulse SLOW, where the difference between the pulse width of the two analog storage control pulses is equal to the pulse width of the UP pulse. For UP pulses the first analog storage control pulse FAST would be wider than the second analog storage control pulse SLOW, while for DOWN pulses the second analog storage control pulse SLOW would be wider than the first analog storage control pulse FAST.

The control stage DCONT provides an output signal D which is fed to the second control input VSUP of the controlled oscillator VCO. Control stage DCONT will be discussed in the following in more detail.

Reference clock REFCLK can be an input clock derived from a real time clock of electronic device 1 (or the circuit board or integrated circuit, if PLL 2 is implemented as a discrete circuit on the circuit board or in an IC). The frequency of the reference clock may be in the range of 1 Hz or lower. This low input frequency usually requires a loop bandwidth in the range of 100 mHz. Reference clock REFCLK is directly coupled to the input of phase frequency detector PFD.

The level shifter LS at the output of controlled oscillator VCO is optionally required if the controlled oscillator VCO is not arranged for producing full swing output clock signal at its output. The output of the level shifter is then the feedback and the output signal PLLOUT. The divider DIV defines the multiplication factor, as noted previously.

Figure 3:
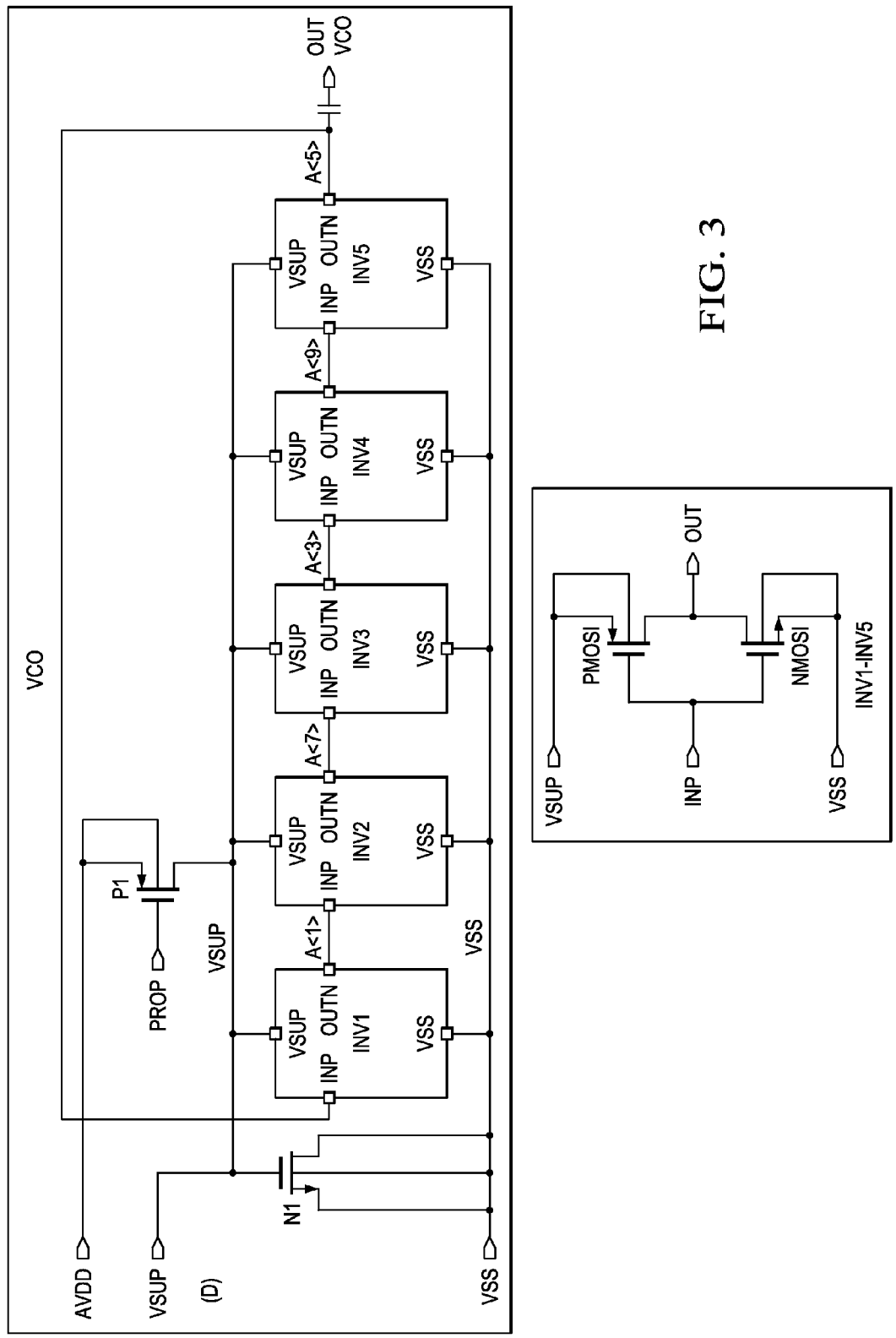
FIG. 3 shows a circuit diagram of the controlled oscillator according to an exemplary embodiment of the invention.

The output signal D of the DCONT is for example and analog signal. In an embodiment, the output D may be a current. Control stage DCONT may optionally generate digital signals A<1:N>. These signals may correspond to the counter value and may be fed back to charge pump CP1 and/or charge pump CP2. These signals could be for example used for compensating the variations due to temperature, supply voltage or production speed. In another embodiment, as will be outlined below in further detail, the output signal OUTVCO of the controlled oscillator VCO or PLL output signal PLLOUT could optionally be fed back to the charge pump CP1 and/or charge pump CP2 for compensating the variations due to temperature, supply voltage or production speed FIG. 3 shows a simplified circuit diagram of an exemplary embodiment of a controlled oscillator VCO that can be used in the phase locked loop according to an embodiment of the invention. The VCO includes five delay stages INV1, INV2, INV3, INV4 and INV5. The output signal OUTVCO of the delay stage INV5 is coupled to the input of the first delay stage INV1 of the controlled oscillator VCO. The controlled oscillator VCO is implemented as a ring oscillator. All stages INV1 to INV5 are connected in series. The last stage INV5 provides a feedback to the first stage INV1. The delay stages INV1 to INV5 may all be implemented as shown in the lower part of FIG. 3. Accordingly, the delay stages INV1 to INV5 are configured as inverters including a PMOS transistor PMOSI and a NMOS transistor NMOSI. The channels of the PMOS transistor PMOSI and the NMOS transistor NMOSI are coupled together as usual for an inverter. The control gates of PMOS transistor PMOSI and NMOS transistor NMOSI are coupled to receive the input signal from the previous stage. The output signal OUT of the inverter is then coupled to the next stage. The controlled oscillator VCO further comprises a PMOS transistor P1 which defines the gain for the analog damping. The current through PMOS transistor P1 in combination with the current received through second control node VSUP defines the frequency of the oscillator. Second control input VSUP is coupled to receive the output signal D of the control stage DCONT. The output of the control stage DCONT is the control signal D. The PMOS transistor P1 receives a first control signal at the first control gate PROP. This input signal PROP is the first control signal of the controlled oscillator VCO and may define the analog damping (fine tuning of the oscillation frequency) in response to the output of the first charge pump CP1 exemplarily shown in FIG. 2. The second control input VSUP of the controlled oscillator VCO is coupled to the output of the control stage DCONT. This may serve to provide the coarse tuning. The negative supply potential/voltage of the circuit is denoted VSS, while the positive supply potential/voltage is denoted AVDD. Generally, it should be noted that the abbreviations VDD, AVDD and DVDD, may all refer to the same positive supply voltage/potential. Similarly, abbreviations VSS, AVSS and DVSS may also refer to the same (negative) supply voltage/potential or ground potential.

Figure 4:
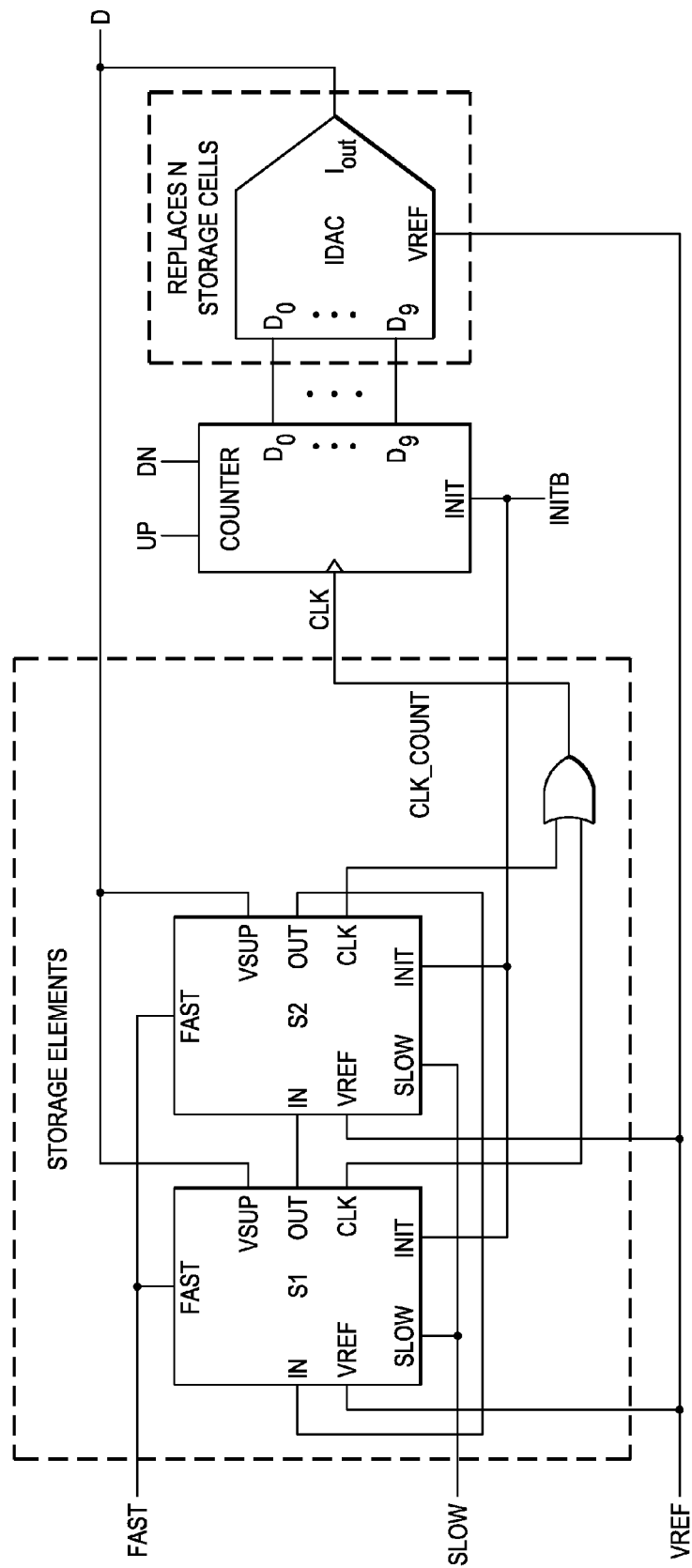
FIG. 4 shows a circuit diagram of the control stage with two storage cells, a counter and DAC according to an exemplary embodiment of the invention.

FIG. 4 shows an exemplary embodiment of a control stage DCONT. The control stage DCONT has two storage elements, a counter and a DAC. The control stage could also comprise more storage elements, which are coupled in a chain. However, using only two storage elements is sufficient for proper functioning of the PLL and may also be advantageous in terms of requiring the least area.

Signal INITB is used to initialize the storage elements and the counter. The storage elements S1 and S2 are coupled in a chain. Output signal OUT of storage element S1 is coupled to input signal IN of storage element S2. Similarly output signal OUT of storage element S2 is coupled to input signal IN of storage element S1. The output VSUP of both storage elements are connected together along with the output signal of digital-to-analog converter DAC. The output signal VSUP of the storage elements may be a current that is superimposed with the output current Iout of the digital-to-analog converter DAC to form the second analog control signal D output by control block DCONT.

Each of the storage elements S1 and S2 has a respective capacitor Cs (see FIG. 5), which are also denoted Cs1 for storage element S1 and Cs2 for storage element S2 in the following. The charging of the capacitors associated with storage elements S1 and S2 is controlled by the first analog storage control signal FAST and a second analog storage control signal SLOW that correspond do signals FS and FL, respectively, described in connection with FIG. 2 above.

To promote a better understanding of the operation of the control stage DCONT, a situation, where there is a continuous UP pulse from the phase frequency detector PFD is assumed in the following. In this scenario, the capacitor Cs1 associated with storage element S1 starts charging from lower voltage threshold (sometimes also referred to as a low potential threshold level herein) to upper voltage threshold (sometimes also referred to as a high potential threshold level herein).

In case the voltage across the capacitor Cs1 crosses a particular threshold value (sometimes also referred to as a mid-potential threshold level herein) for the first time the output signal OUT of the storage cell S1 may turn from low logic level to high logic level. This triggers storage cell S2 to start charging its capacitor Cs2 and thereafter both capacitors Cs1 and Cs2 keep charging. This ensures that upon start of the locking procedure of the PLL not both of the storage cells charge or discharge their capacitor, but the (dis)charging of one of the storage cells is triggered by the other storage cell (which is active, i.e. charging or discharging its capacitor).

As the capacitor Cs1 reaches the upper threshold voltage level, storage element S1 is reset. The reset pulls the voltage across capacitor C1 back to the lower threshold level. At the same time storage element S1 outputs a clock pulse CLK_UP to the counter (though the OR gate shown in FIG. 4). This increments the counter by one count thereby increasing the DAC output current by the same amount as that supplied by the storage element when the capacitor is charged to the higher threshold level. The capacitor Cs1 continues to charge towards the upper threshold voltage as long as the UP pulse is present. As the voltage across capacitor Cs2 reaches the upper threshold, similar to capacitor Cs1, storage element S2 is reset by pulling the voltage across capacitor Cs2 to the lower threshold voltage and a clock pulse CLK_UP is provided from storage element S2 to the counter incrementing the counter value. Capacitor Cs2 continues to charge towards the upper voltage once again and this cycle continues as long as the UP pulse is present.

This way the counter tracks the number of times the capacitors are charged from lower threshold to upper threshold (charging cycles). The count of the charging cycles is supplied as digital information to the DAC, which in turn outputs an equivalent analog current Iout. The sum of analog current Iout and the currents on the output VSUP of the storage elements S1 and S2, which may be proportional to the voltage across the respective capacitors Cs1 and Cs2, form the output current signal D which is provided to the second control input VSUP of the controlled oscillator VCO to adjust its oscillation frequency.

Next, another scenario, where there is a continuous DOWN pulse from the phase frequency detector PFD is assumed in the following for exemplary purposes. In this scenario, the capacitor Cs1 associated with storage cell S1 starts discharging from its present voltage level to lower voltage threshold.

Similar to the situation outlined above, when the voltage across the capacitor Cs1 crosses a particular threshold value for the first time, the output OUT of the storage cell S1 turns from low logic level to high logic level. This triggers the second storage cell S2 to start discharging its capacitor Cs2 and thereafter both capacitors Cs1 and Cs2 keep discharging.

As the capacitor Cs1 reaches the lower threshold voltage level, storage element S1 is reset by pulling the voltage across capacitor C1 is back to the upper threshold level. At the same time, storage element S1 provides a clock pulse CLK_DOWN to the counter. This decrements the counter by one count thereby decreasing the DAC output current by the same amount as that supplied by the storage element when the capacitor is charged to the higher threshold level. The capacitor Cs1 continues to discharge towards the lower threshold voltage as long as the DOWN pulse is present. As the voltage across capacitor Cs2 reaches the lower threshold, similar to Cs1, storage element S2 is reset, i.e. the voltage across capacitor Cs2 is pulled to upper threshold voltage and a clock pulse CLK_DOWN is provided to the counter decrementing the counter value. Capacitor Cs2 continues to discharge towards the lower voltage once again and this cycle continues as long as the DOWN pulse is present.

This way the counter tracks the number of times the capacitors are discharged from upper threshold to lower threshold (discharging cycles) and supplies this information to the DAC, which in turn outputs an equivalent analog current Iout. The sum of analog current Iout and the currents on the output VSUP of the storage elements S1 and S2, which may be proportional to the voltage across the respective capacitors Cs1 and Cs2, form the output current signal D which is provided to the second control input VSUP of the controlled oscillator VCO to adjust its oscillation frequency.

As becomes more apparent from FIG. 10 discussed below, when one of the capacitors is pulled to lower or upper threshold value the other capacitor will be in the middle of the tuning region. This can be considered an analog mode tuning of the controlled oscillator VCO.

Figure 5:
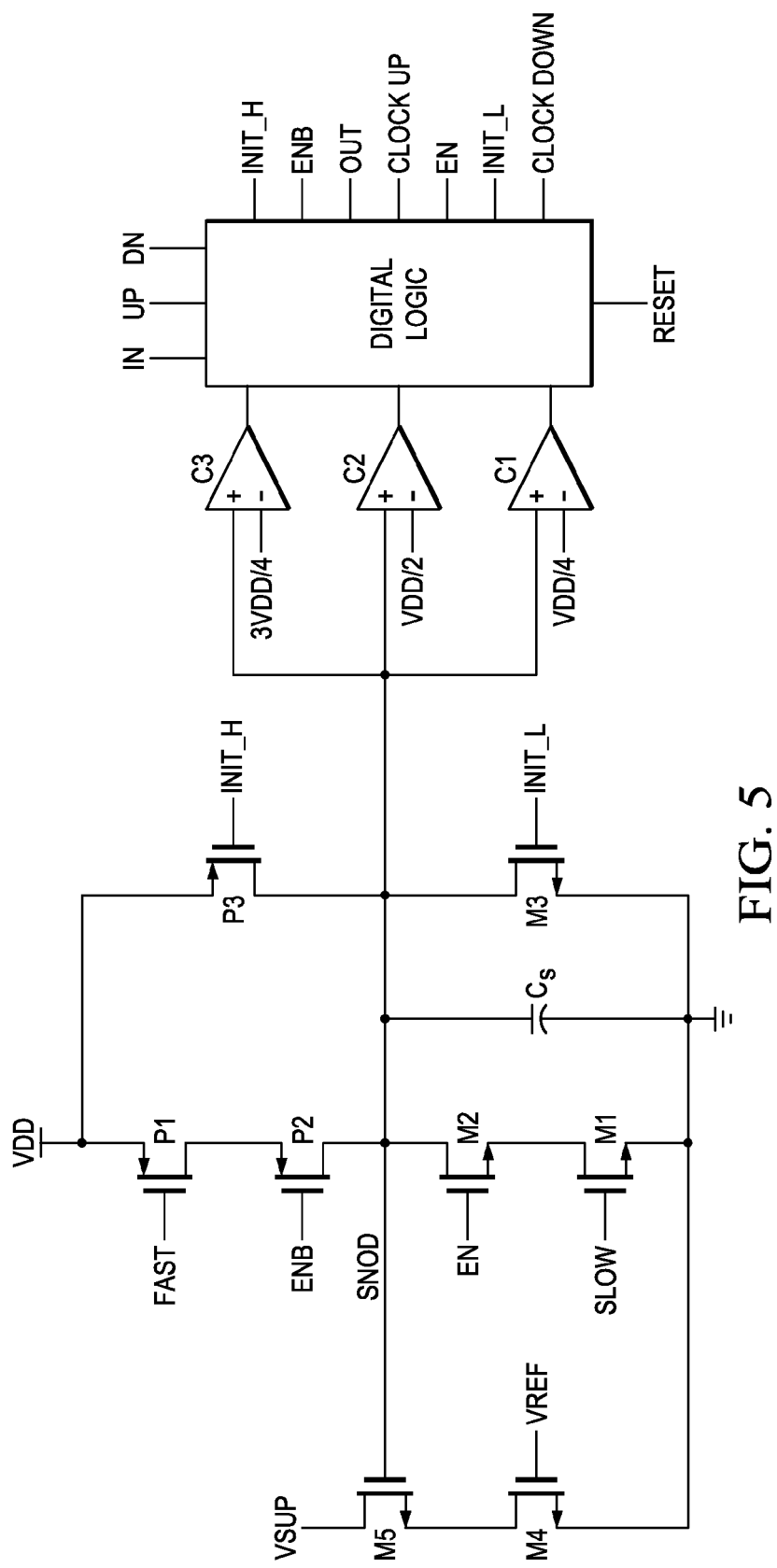
FIG. 5 shows a circuit diagram of the storage element according to an exemplary embodiment of the invention.

FIG. 5 shows an exemplary implementation of a storage element according to an embodiment of the invention. The storage node SNOD is coupled to the control gate of the transistor M5. Drain of the transistor M5 is coupled to the output node VSUP and the source is coupled to the drain of M4. Storage node SNOD being coupled to the control gate of the transistor M5 causes transistor M5 to output a current at the output VSUP of the storage element, which corresponds to the voltage across capacitor Cs.

Source terminal of M4 is coupled to the ground supply level and the gate terminal is connected to a DC bias level VREF. Transistors P1 and M1 controlled by first analog storage control signal FAST and second analog storage control signal SLOW. The pulse widths of these signals determine the charging and discharging current of the capacitor Cs. The transistors P2 and M2 controlled by enable signals EN and ENB, which determine when the storage cell starts charging and discharging of the capacitor Cs. When the storage cell is reset, the enable signals EN and ENB may be set so that transistors P2 and M2 are turned off. This allows staggering the capacitors charging and discharging such that when the capacitor (e.g. Cs1) is actively pulled back to upper or lower threshold level the other capacitor (e.g. Cs2) of the other storage cell will be well within the analog tuning range.

Transistor M3 is controlled by init signal INIT_L and transistor P3 is controlled by init signal INIT_H. The comparators C1, C2 and C3 have one of their inputs connected to the node SNOD. The other input of these comparators is connected to respective fixed DC potentials, which define the low, mid and high potential threshold levels discussed above. In this example, the three potential threshold levels are VDD/4, VDD/2 and 3*VDD/4. When the voltage at node SNOD is above VDD/4, output of comparator C1 turns high. Similarly when the node SNOD is above VDD/2 level the output of comparator C2 turns high. When SNOD crosses 3*VDD/4 the output of comparator C3 goes high. The digital logic an input signal IN of the storage cell. The digital logic uses these three outputs along with UP pulses, DOWN pulses, and IN signal to control the pull back of capacitors, increment/decrement the counter as well as staring the charging/discharging of capacitors by signals INIT_H, INIT_L, CLK_UP and CLK_DOWN, EN and ENB.

The digital logic supplies a high pulse on the INIT_L signal whenever the capacitor Cs charges up to the upper threshold level 3*VDD/4. This event produces a pulse on the clock output CLK_UP of the storage cell to increment the counter by one count. Furthermore, this event causes the logic to actively pull back the node SNOD to lower threshold value VDD/4 and thereby reducing the output current through the output D to its minimum. It should be noted that when the potential at node SNOD reaches VDD/4, comparator C1 will turn high, which stop the logic to deassert the INIT_L signal to transistor M3. While resetting the storage element, the logic may control the EN and ENB signals so that they disable transistors P2 and M2. An increment of the counter value increments the current Iout at the output of DAC. This current increment Icell may be equal to the current supplied by the fully charged storage capacitor Cs.

The logic provides a low pulse on INIT_H whenever the capacitor Cs discharges down to VDD/4 level. This event produces a clock pulse on clock output CLK_DOWN of the storage cell so as to decrement the counter by one count. Furthermore, this event causes the logic to actively pull back the node SNOD to lower threshold value 3*VDD/4 and produces maximum current Icell from the VSUP output, thereby reducing the current at the output of DAC by the same amount as Icell. It should be noted that when the potential at node SNOD reaches 3*VDD/4, comparator C3 will turn high, which stop the logic to deassert the INIT_H signal to transistor P3. While resetting the storage element, the logic may control the EN and ENB signals so that they disable transistors P2 and M2.

In one exemplary embodiment, the output signal OUT of storage element S1 is initialized to low logic level and the output signal OUT of storage element S2 is initialized to high logic level. The storage element S1 asserted high on its output OUT, whenever the voltage across capacitor Cs first crosses the middle of the tuning region (e.g. VDD/2). The EN signal may be asserted by the logic in response to the input signal IN, e.g. whenever signal IN is high logic level. The signal ENB is the inverted signal EN. Hence, upon starting the locking procedure of the PLL, the input signal IN of the second storage cell S2 thus controls the timing of the start of a (dis)charging operation by controlling the gates of transistors M3 and P2. Signal EN controls the gate of NMOS transistor M3, while signal ENB controls the gate of the PMOS transistor P3. Assuming for example that the storage cells S1 and S2 are both initialized to the low potential threshold level, the logic of storage cell S2 will thus assert signals EN and ENB when the capacitor Cs1 in the other storage cell S1 is at the middle of the tuning region (e.g. VDD/2), which ensures that the capacitors always have a voltage difference of VDD/4 between them. This makes sure that one of the capacitors is at the middle of the tuning region while the other capacitor is being pulled back.

It should be noted that the OUT signal an IN signal of the storage elements is not essential for the proper operation of the PLL. In another embodiment, the storage cells S1 and S2 are not chained by connecting the output signal OUT of one storage cell to the input signal IN of the other storage cell in the manner described above. Indeed there may be no terminals OUT and IN in the storage cells in this embodiment. Accordingly, also no comparator (as it is shown in FIG. 5) for the mid potential level VDD/2 is needed in the storage cells. Both storage cells are active, i.e. charge or discharge their capacitors in response to the first analog storage control pulse FAST and the second analog storage control pulse SLOW. The storage cells may for example only be disabled in the short period of the resetting same. To ensure proper functioning of the PLL, the voltages across the capacitors of the two storage cells are initialized to be VDD/4 apart, e.g. to 3*VDD/8 and 5*VDD/8, VDD/4 and VDD/2, etc. When a storage cell hits either the high threshold potential level or the low threshold potential level, it will reset and increase/decrease the counter by outputting a pulse CLK_UP/CLK_DOWN in the manner described above.

In this embodiment, it is of course advantageous that the storage cells are designed so as to provide the same charging/discharging rate in response to the first analog storage control pulse FAST and the second analog storage control pulse SLOW in order to ensure that the voltage difference across the two capacitors remains VDD/4.

If this cannot be assured, according to another exemplary embodiment, in principle, once a storage cell resets, it stops charging/discharging until the respective other storage cell indicates that it has crossed the mid threshold potential level (e.g. VDD/2). Once this trigger from the other storage cell is received, the storage cell continues charging/discharging in response to the first analog storage control pulse FAST and the second analog storage control pulse SLOW. In this exemplary embodiment, the storage cells S1 and S2 could be configured as described in connection with FIGS. 4 and 5 above. However, the each storage cell outputs a pulse at its output OUT to the input IN of the respective other storage cell, each time the voltage across its capacitor Cs crosses the mid threshold potential level. Of course the storage cell does not output such pulse during its reset, but only during (dis)charging operation in response to the analog storage control pulses FAST and SLOW. The comparator C2 as shown in FIG. 5 could be used for this purpose. The respective other storage cell may buffer/latch this pulse to ensure proper operation, e.g. when the pulse on the storage cells input IN is shortly before the (dis)charging operation in response to the analog storage control pulses FAST and SLOW makes the voltage on the capacitor Cs cross the mid threshold potential level (e.g. VDD/2). Hence, in this latter case, the storage cell would immediately continue the (dis)charging operation after reset. This way the voltage difference across the capacitors of the storage cells S1 and S2 can be maintained VDD/4 apart from each other. As in the previous embodiment, the voltages across the capacitors of the two storage cells may be for example initialized to be VDD/4 apart, e.g. to 3*VDD/8 and 5*VDD/8, VDD/4 and VDD/2, etc.

Figure 6:
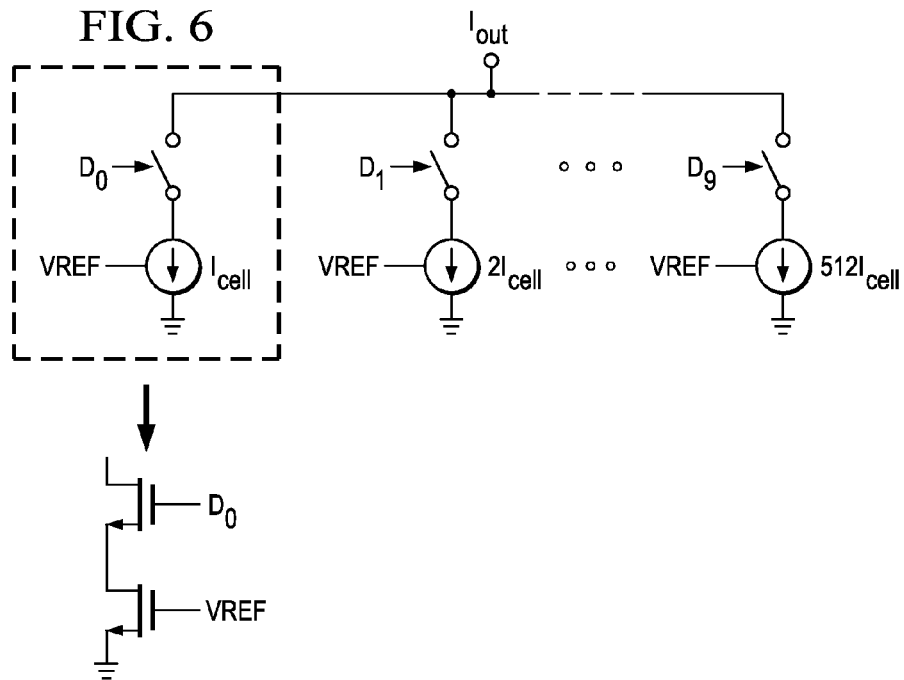
FIG. 6 shows the circuit level implementation of the DAC according to an exemplary embodiment of the invention.

FIG. 6 shows the circuit level implementation of the DAC according to an exemplary embodiment of the invention. Each digital bit Dn of the counter that is received at the inputs Dn of the DAC turns on a current source inside the DAC. The DAC implementation in this example has 10 digital inputs D0 to D9. The least significant bit D0 turns on a current source of value Icell and the most significant bit D9 turns on a current source of value 512*Icell. Every other intermediate bits turns on a current source of value increasing in a geometrical fashion as Icell, 2*Icell, 4*Icell etc. the DAC thus provides a current output which corresponds to the digital bits at its input. The current Icell may be for example equal to the voltage drop of a fully charged capacitor Cs of the storage elements A single current source having an output current of Icell in the DAC could for example comprise two transistors. The lower transistor may have the same properties as the transistor M4 in FIG. 5 and may be controlled by the DC bias level VREF. The lower transistor provides the same current as the storage cell. The upper transistor may (also) have the same properties as transistor M5 in FIG. 5 and controls the turning ON/OFF of the current source using the digital bits D0 to D9. The current source of value 2*Icell has two such current sources connected together and so on.

Figure 7:
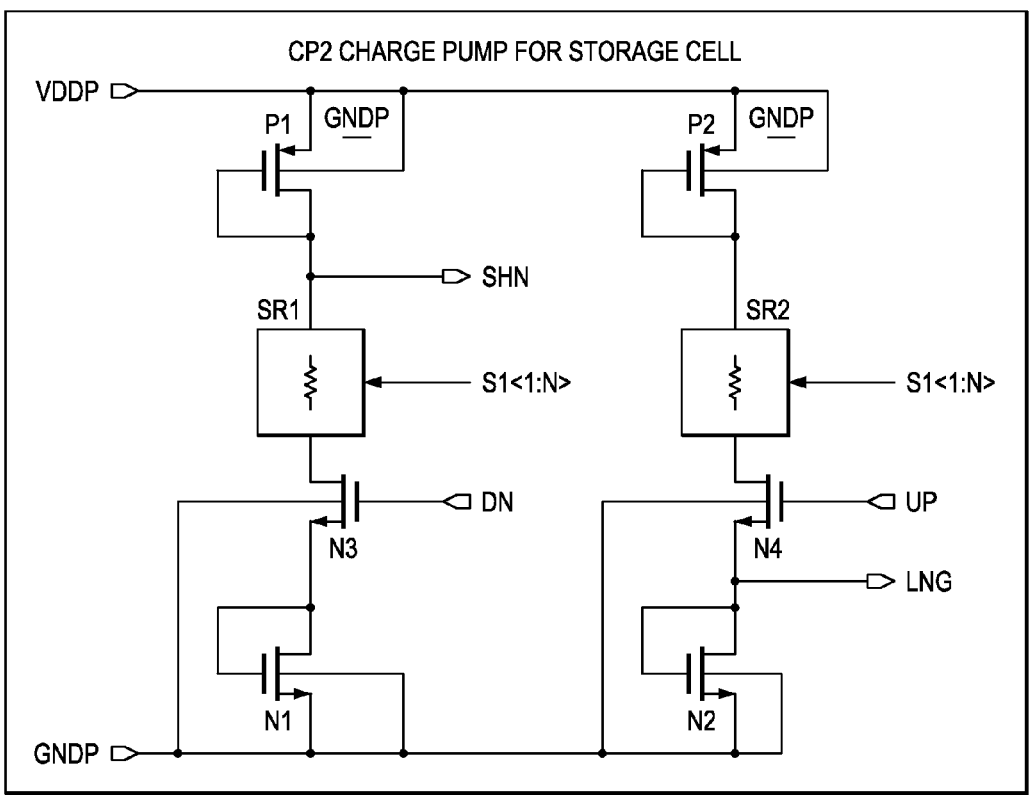
FIG. 7 shows a simplified circuit diagram of a charge pump for a storage element according to an exemplary embodiment of the invention.

FIG. 7 shows a simplified circuit diagram of a charge pump for a storage element S1 according to an exemplary embodiment of the invention. The charge pump implementation of FIG. 7 could be for example used to implement charge pump CP2 shown in FIG. 2. The input signals are the UP and DOWN pulses received from the phase frequency detector PFD and are connected to the gates of NMOS transistors N3 and N4, respectively. These transistors act as switches. PMOS transistor P1 and NMOS transistor N2 form two current mirrors through signals SHN and LNG and inside the storage elements with PMOS transistor P1 and NMOS transistor N2. PMOS transistors P1 and P2 and NMOS transistors N3 and N4 as well as NMOS transistors N1 and N2 are matched and should have exactly the same width-to-length-ratio and other properties. This means that the current through the two branches will be the same. The stages SR1 and SR2 are optional and consist of series of the resistors, which is explained in more detail with respect to FIG. 8.

The stages SR1 and SR2 serve to adjust the currents through the branches in order to compensate process, temperature and voltage variations (PVT compensation) in response to the counter value of the counter of the control stage DCONT, which can be considered indicative of the current consumed by the controlled oscillator. As shown in FIG. 2, the counter value is fed back as signal A<1:N> to the control stage DCONT (input signal S<1:N>).

Figure 8:
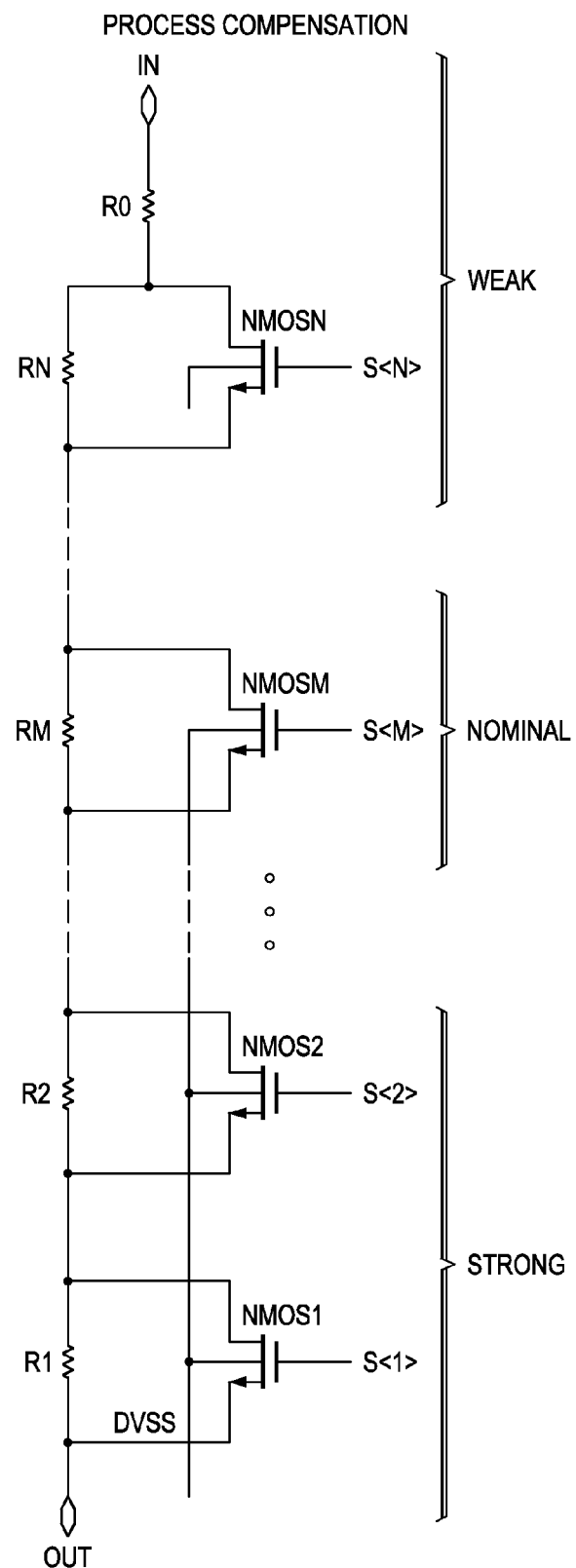
FIG. 8 shows an exemplary implementation of the blocks SR1 and SR2 of FIG. 7 according to an exemplar embodiment of the invention.

FIG. 8 shows a simplified circuit diagram of the stages SR1 and SR2 shown in FIG. 7. A number of resistors R1 to RN are coupled in series. Each resistor R1 to RN is coupled to corresponding NMOS transistor NMOS1 to NMOSN. The resistance of the series of resistors and NMOS transistors is reduced by switching the NMOS transistors NMOS1 to NMOSN on responsive to the counter value of the counter. The resistance is maximum, if none of the transistors is switched on and minimum if all transistors are switched on. This can be used in order to adjust a current for compensating process, temperature or supply voltage variations.

Figure 9:
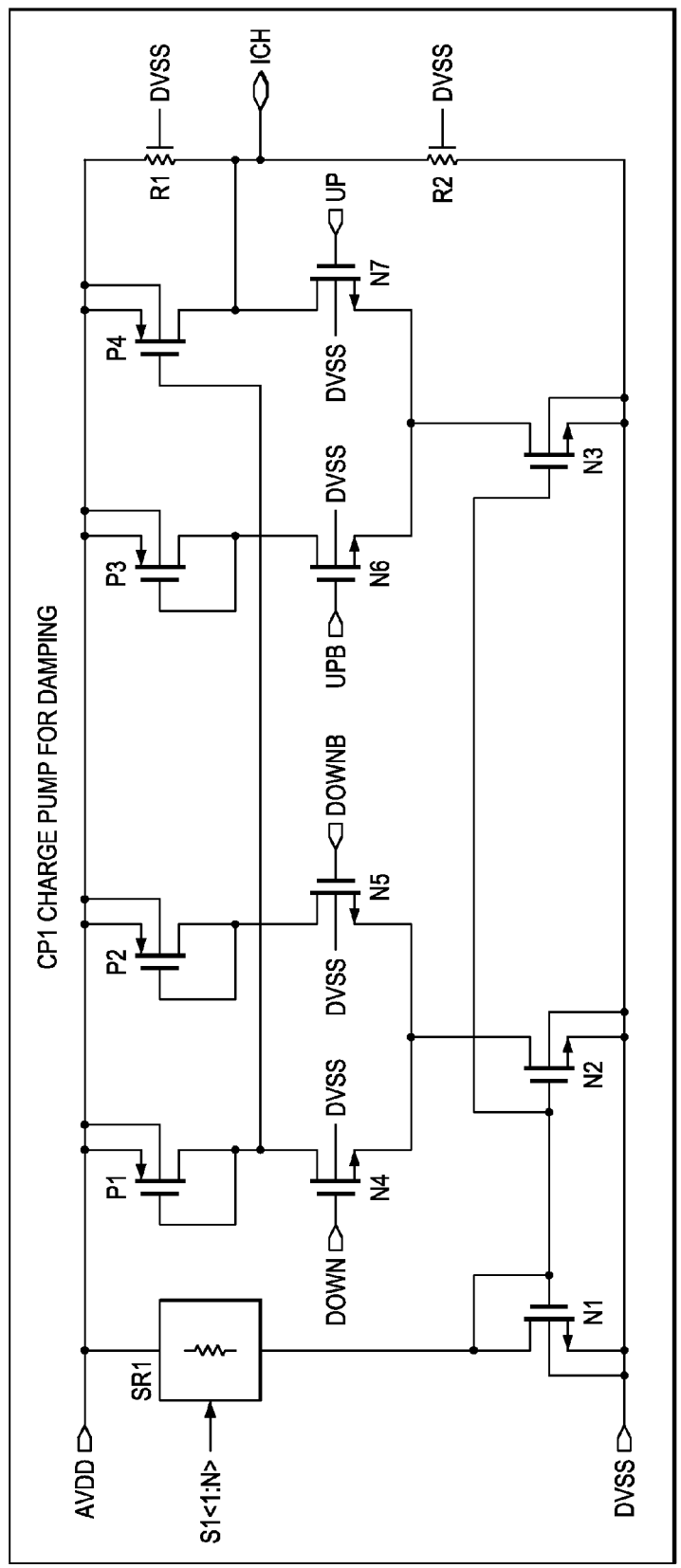
FIG. 9 shows a simplified circuit diagram of an exemplary embodiment of the first charge pump CP1 shown in FIG. 2.

FIG. 9 shows a simplified circuit diagram of an exemplary embodiment of the first charge pump CP1 shown in FIG. 2. The charge pump also receives the UP and DOWN signals (and its inverted versions UPB and DOWNB) from the phase frequency detector PFD. There is also a stage SR1 similar to the stages SR1 and SR2 shown in FIG. 7. This stage SR2 is used to define the current through NMOS transistor N1. The current through NMOS transistor N1 is mirrored into NMOS transistors N2 and N3. The resistors R1 and R2 form a voltage divider that generates half the supply voltage level AVDD (or the positive rail potential/voltage). If signal DOWN changes from low to high, PMOS transistor P1 starts to mirror current to PMOS transistor P4 which in turn supplies current to node ICH. A capacitance C1 is coupled as shown in FIG. 2 to node ICH. If signal UP turns high, then NMOS transistor N7 is turned on and sinks the current from node ICH. In the normal operation of the phase locked loop, a sequence of UP and DOWN pulses will be produced by the phase frequency detector PFD, which will then supply or sink current from the capacitor C1 connected to output ICH of the charge pump. This will in turn provide a voltage jump or drop for each UP or DOWN pulse that is proportional to the width of the UP and DOWN pulse. However, if no UP or DOWN pulses are present, the resistive divider R1, R2 pulls the voltage level at ICH to ½ of the power source voltage AVDD.

Figure 10:
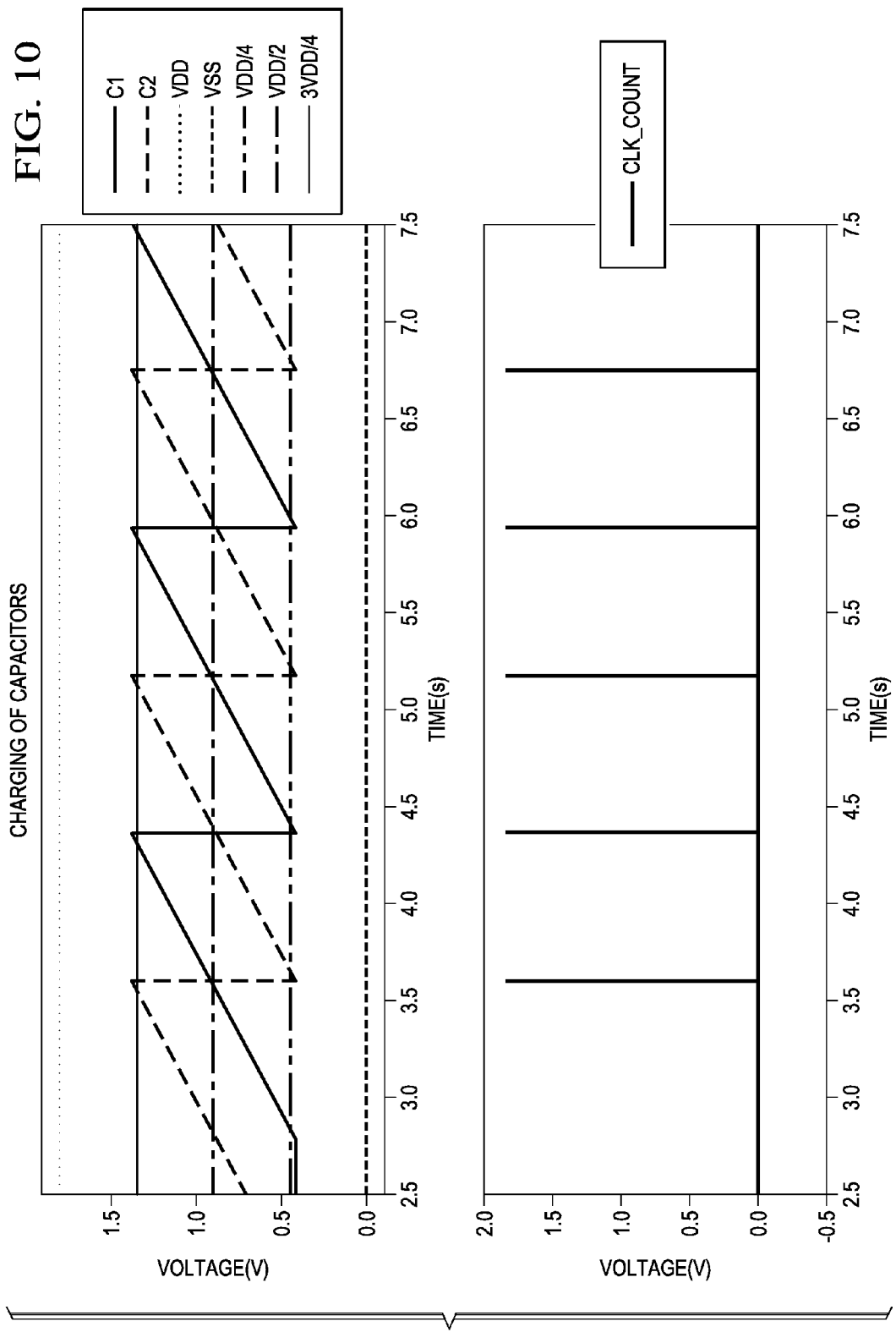
FIG. 10 shows the waveforms illustrating the working of the storage cells in the presence of a continuous UP pulse according to an exemplary embodiment of the invention.

FIG. 10 shows the waveforms illustrating the working of the storage cells in the presence of a continuous UP pulse as explained in the first scenario. The voltages of capacitors Cs1 and Cs2 are shown as C1 and C2. As the voltage C1 reaches the upper threshold of 3*VDD/4 it is pulled back to the lower threshold of VDD/4. This event also produces a clock pulse CLK_UP (CLK_COUNT) to increment the counter by one bit. During the time the voltage C1 of capacitor Cs1 is pulled back to lower threshold value, the voltage C2 of capacitor Cs2 is in the middle of the tuning range. Similarly the voltage C2 of capacitor Cs2 is pulled back to lower threshold of VDD/4 once it charges up to 3*VDD/4 and the event also produces a clock pulse CLK_UP for the counter, which increments the counter by one bit. One capacitor of the storage cells always stays in the middle of the tuning region as the charging of the capacitors are controlled such that they are staggered.

Figure 11:
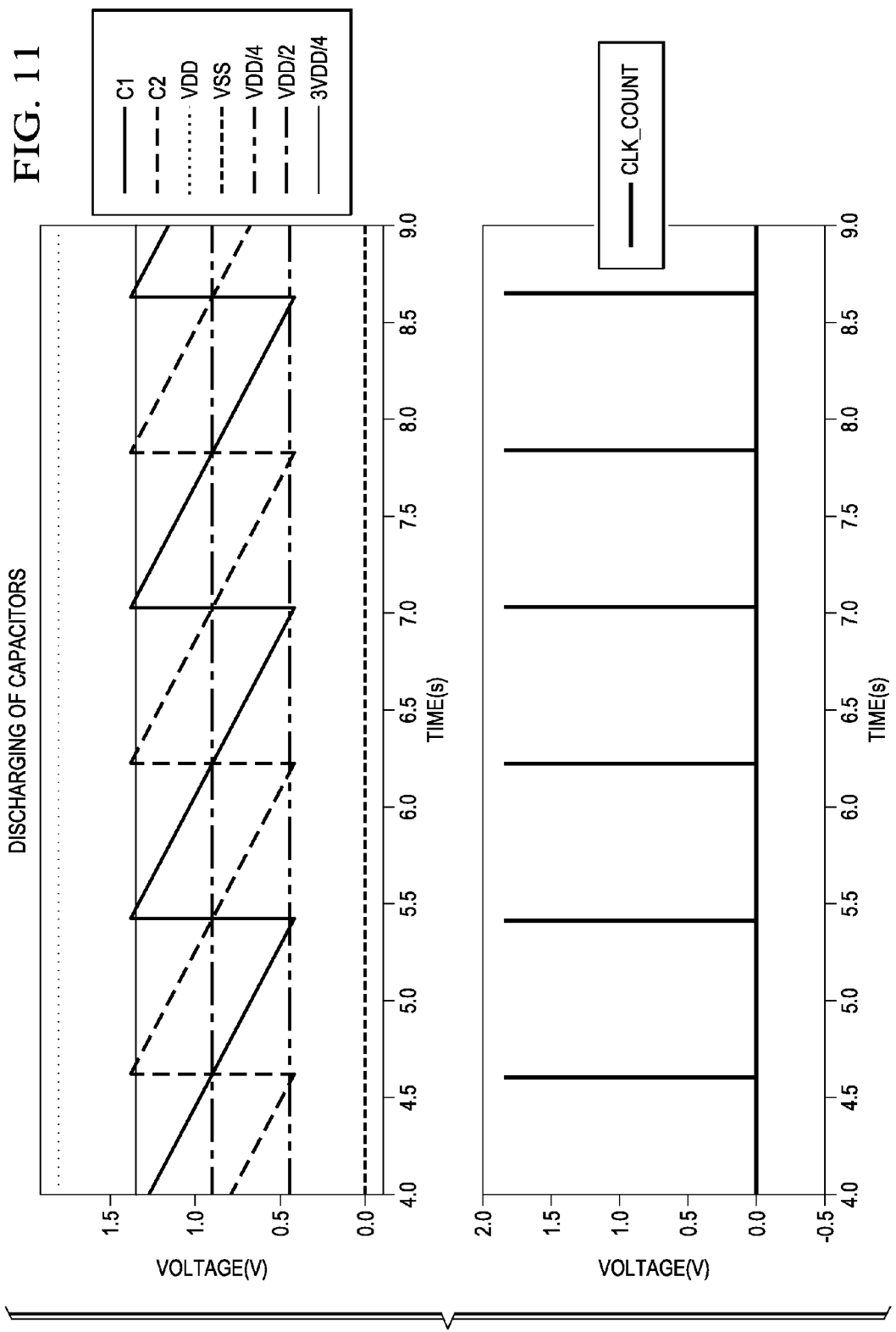
FIG. 11 shows the waveforms illustrating the working of the storage cells in the presence of a continuous DOWN pulse according to an exemplary embodiment of the invention.

FIG. 11 shows the waveforms illustrating the working of the storage cells in the presence of a continuous DOWN pulse as explained in the second scenario. The voltages of Cs1 and Cs2 are shown as C1 and C2 in this figure. As the voltage C1 reaches the lower threshold of VDD/4 it is pulled back to the upper threshold of 3*VDD/4. This event also produces a clock pulse CLK_DOWN (CLK_COUNT) to decrement the counter by one bit. During the time the voltage C1 of capacitor Cs1 is pulled back to upper threshold value, voltage C2 of capacitor Cs2 is in the middle of the tuning range. Similarly capacitor Cs2 is pulled back to upper threshold of 3*VDD/4 once it discharges to VDD/4 and the event also produces a clock pulse CLK_DOWN for the counter to decrement the counter by one bit. Again, one capacitor of the storage cells always stays in the middle of the tuning region as the discharging of the capacitors are controlled such that they are staggered.

Figure 12:
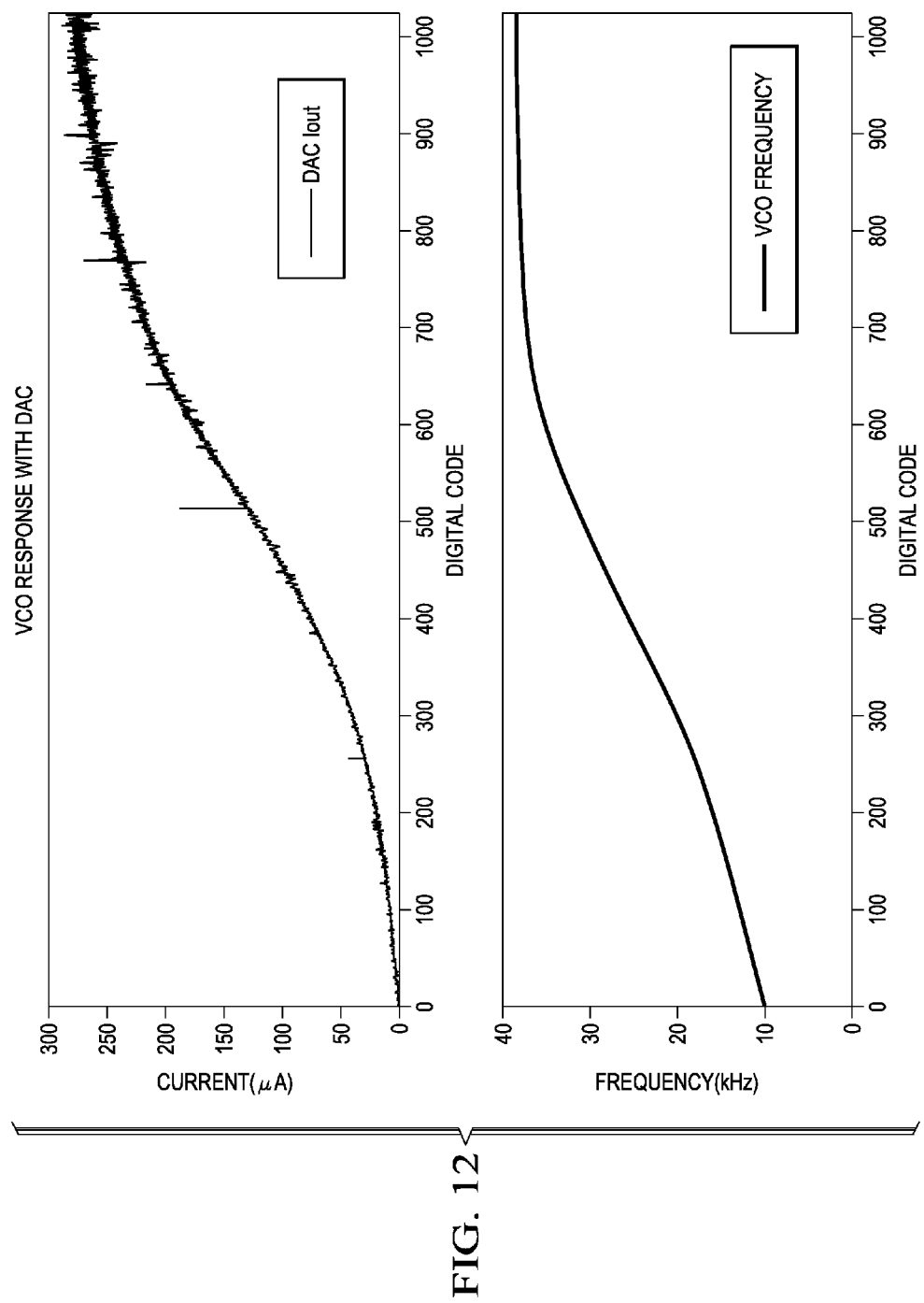
FIG. 12 shows simplified waveform of current output of DAC and frequency output of controlled oscillator according to an exemplary embodiment of the invention.

FIG. 12 shows the waveforms illustrating the working of the DAC and the controlled oscillator VCO. The DAC input is controlled by the counter output. The counter is continuously increased from 0 to its maximum value of 1023. As seen in the diagram, the current at the output of DAC increases as the counter value is increased. The figure also shows the measured value of VCO output frequency which also increases with the counter value.

Furthermore, when starting the procedure of locking the PLL to the target frequency provided to the phase frequency detector PFD on its input REFCLK, if a safest but slower locking to the target frequency is desired, the counter value and the voltages across the capacitors of the storage cells may be initialized to zero. If a faster locking procedure is desired, the voltage across the capacitors of the two storage cells S1 and S2 may be initialized to have a voltage difference of that is one half of the difference of the upper and lower threshold value, e.g. VDD/4 (depending on how the threshold levels are selected relative to VDD). Furthermore, in this latter case the counter value may be initialized to a value that is approximately corresponding to the center frequency of the frequency range covered by the PLL.

Figure 13:
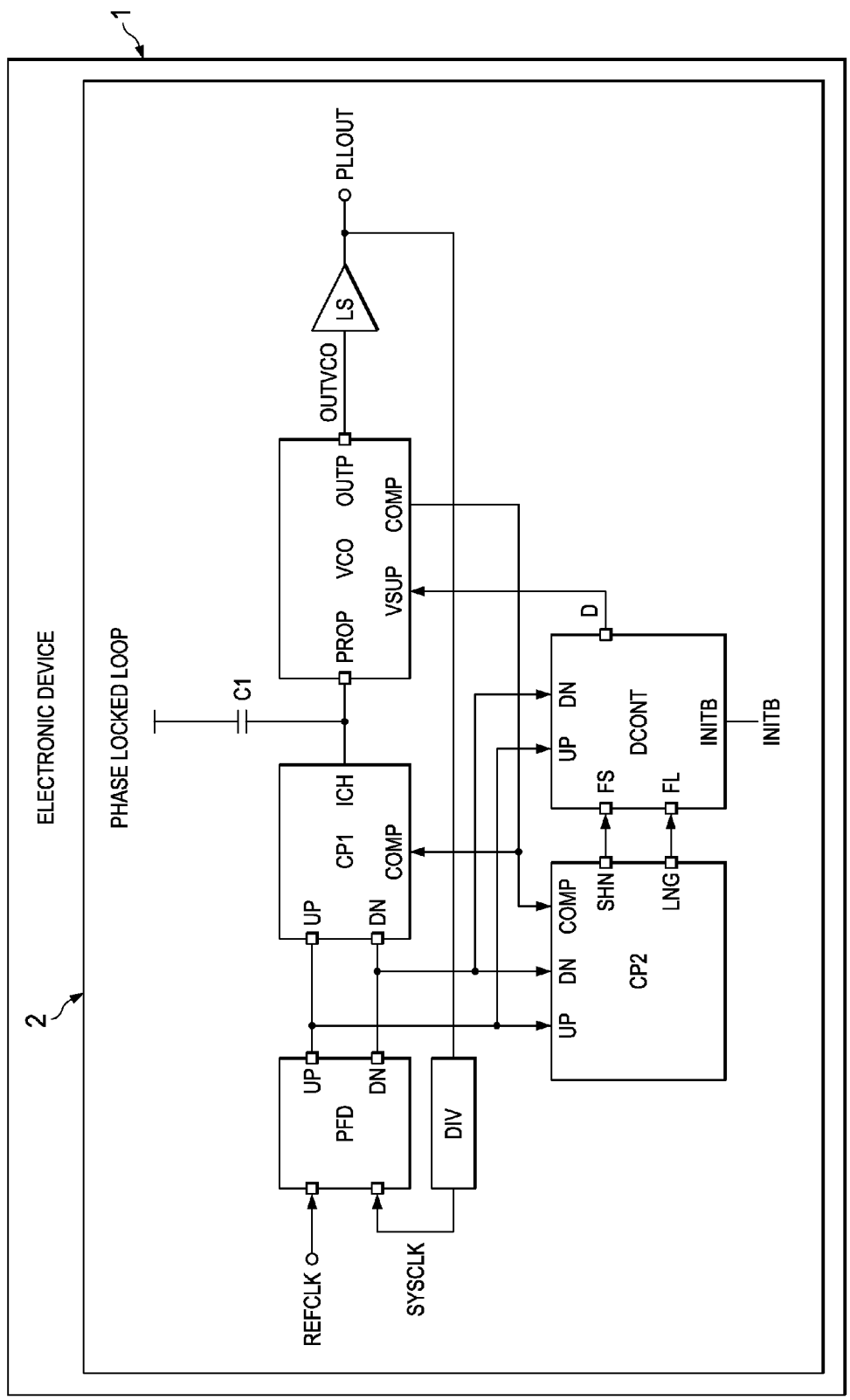
FIG. 13 shows a simplified block diagram of another electronic device comprising a PLL according to an exemplary embodiment of the invention.

As noted above, in another aspect of the invention, an improved process-voltage-temperature (PVT) compensation technique for the PLL is suggested. In this aspect the current consumed by the VCO is used as an indication of the operating point (process, voltage and temperature) of the phase locked loop, respectively, the chip/integrated circuit (IC) comprising the same. FIG. 13 shows another electronic device 1 including a PLL 2 in accordance with an exemplary embodiment of the invention. The PLL 2 of FIG. 13 is essentially identical to that of FIG. 2 except for the compensation signal COMP for process compensation being provided from the control oscillator VCO instead of the control stage DCONT. In FIG. 13, the controlled oscillator VCO has an output providing a compensation signal COMP to the charge pumps CP1 and CP2. This signal COMP is used to compensate the performance of the device for the variations in process, voltage and temperature. The voltage COMP is indicative of the current consumed by the controlled oscillator VCO and is used inside charge pump CP1 and CP2 to adjust the charge pump currents such that the bandwidth and loop dynamics of the phase locked loop remains fairly constant across all operating conditions.

FIG. 14 shows an exemplary and simplified circuit diagram of another embodiment of controlled oscillator VCO in line with this aspect of the invention that could be used in the PLL 2 of FIG. 13. Please note that the controlled oscillator as shown in FIG. 14 could also be used in the PLL 2 described with reference to FIG. 2 above, e.g. instead of the controlled oscillator of FIG. 3.

The controlled oscillator VCO includes five delay stages INV1, INV2, INV3, INV4 and INV5. The output signal OUT-VCO of the delay stage INV5 is coupled to the input of the first delay stage INV1 of the controlled oscillator VCO. The controlled oscillator VCO is again implemented as a ring oscillator. All stages INV1 to INV5 are connected in series. The last stage INV5 provides a feedback to the first stage INV1. The delay stages INV1 to INV5 may all be implemented as shown in the lower part of FIG. 14.

Accordingly, the delay stages INV1 to INV5 are configured as inverters including a PMOS transistor PMOSI and a NMOS transistor NMOSI. The channels of the PMOS transistor PMOSI and the NMOS transistor NMOSI are coupled together as usual for an inverter. The control gates of PMOS transistor PMOSI and NMOS transistor NMOSI are coupled to receive the input signal from the previous stage. The output signal OUT of the inverter is then coupled to the next stage. As can be seen by comparing the controlled oscillator implementations of FIG. 3 and FIG. 14, the inverter stages INV1 to INV5 are connected to the second control input VSUP and positive potential of the power supply AVDD in FIG. 3, while they are connected to the second control input VSUP and potential of a second power supply VSS in FIG. 14.

The controlled oscillator VCO further comprises a NMOS transistor N1 which defines the gain for the analog damping. The current through NMOS transistor NMOSI in combination with the current received through second control node VSUP defines the frequency of the oscillator. Second control input VSUP is coupled to receive the output signal D of the control stage DCONT. The NMOS transistor N1 receives a first control signal at the first control gate PROP. This input signal PROP is the first control signal of the controlled oscillator VCO and may define the analog damping (fine tuning of the oscillation frequency) in response to the output of the first charge pump CP1. The second control input VSUP of the controlled oscillator VCO is coupled to the output D of the control stage DCONT. This may serve to provide a coarser tuning In comparison to FIG. 3, FIG. 14 further comprises another block COMP1 for process compensation. The block COMP1 is designed such that it has the same structure as an inverter stage. The only difference is that the inverter output signal COMP is coupled to the gates of PMOS transistor PMOSI and NMOS transistor NMOSI, instead of the gates being driven by the input signal INP of a previous inverter. This configuration of block COMP1 may ensure that during any time, the current consumed by the block COMP1 changes proportional to the current consumed by the controlled oscillator VCO. When a particular device is in a slow PVT corner, the controlled oscillator VCO takes more current to produce the target frequency and the same change is reflected in the current COMP output by block COMP1. Another device may be operating in strong PVT conditions, where the controlled oscillator VCO needs less current for oscillating at the target frequency. In this scenario, the current COMP output by the block COMP1 will be less than the nominal value. Thus the signal COMP reflects the operating condition of the device and can be used to compensate the circuit for process, voltage and temperature variations, as exemplarily outlined in the following in more detail.

Figure 15:
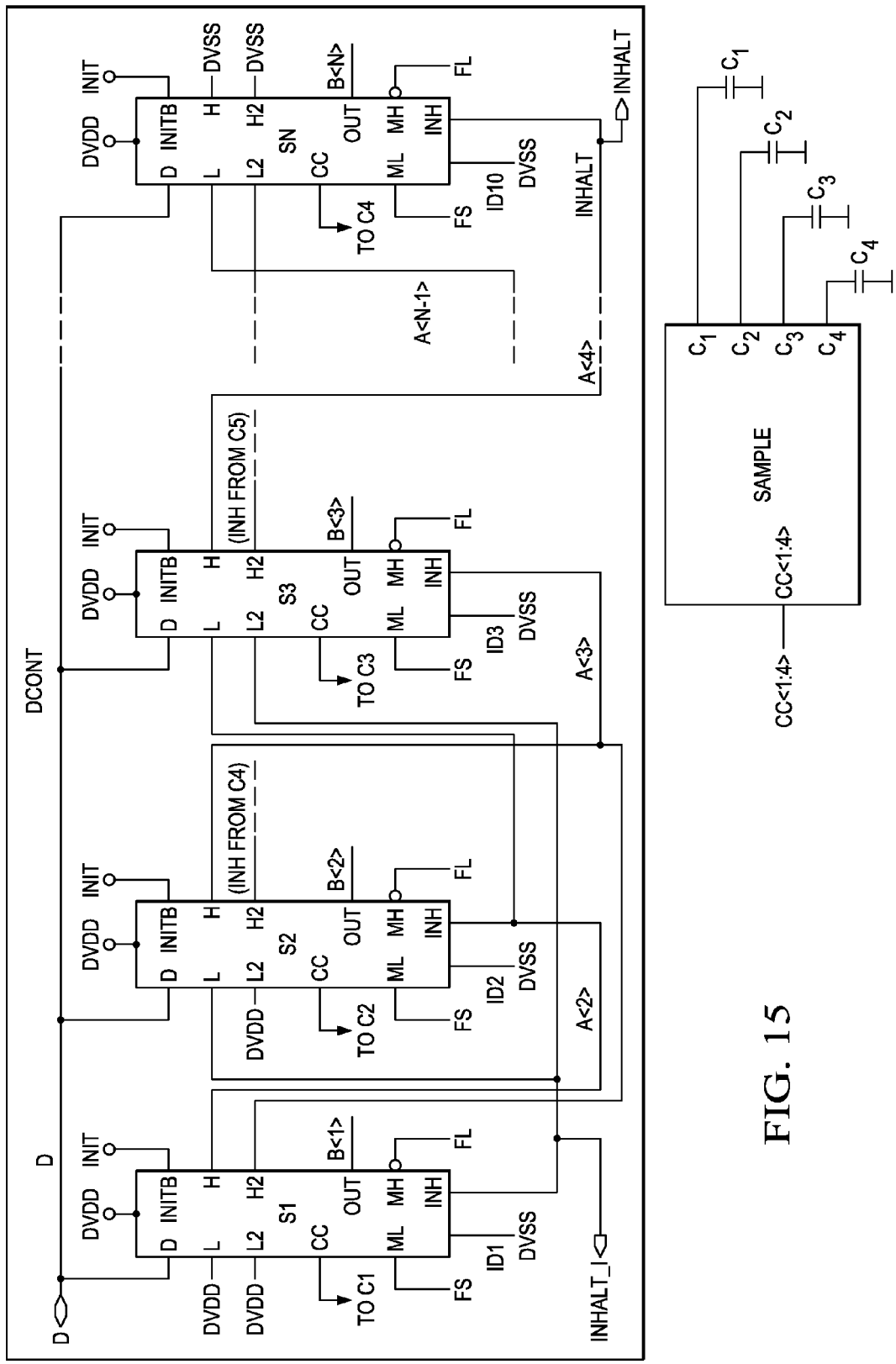
FIG. 15 shows a circuit diagram of the control stage according to another exemplary embodiment of the invention.

FIG. 15 shows simplified circuit diagram of another exemplary embodiment of a control stage DCONT that could be used in PLL 2 of FIG. 13 or FIG. 2 instead of the control stage in FIG. 4. The control stage DCONT of FIG. 15 comprises a number N of storage elements S1 to SN. In one embodiment N is 4 and each storage element is coupled to a respective storage capacitor. However in other implementations, N may be also larger than 4, e.g. about 100 or 200. In the following, it will be exemplarily assumed that there are more than 4 storage elements and that—in exemplary embodiments—the storage elements share storage capacitances. When there are only 4 storage elements, each storage element may be connected to its own storage capacitor Cs, as noted above.

Each storage element has an input L, an input H, an input L2, an input H2, an input FS and an input FL, an input INITB, an output OUT and an output CC, as well as an output INH. The output INH of one storage element is coupled to the input L of the subsequent storage element and to the input H of the preceding storage element. Signals INITB are used for initializing the storage elements.

The storage elements S1 to SN are coupled in a chain. The first storage element S1 has no preceding storage element. The last storage element SN has no subsequent storage element. The other storage elements S1 (S2 to SN−1) always have respective preceding and subsequent storage elements. For example, storage element S2 has a preceding storage element S1 and subsequent storage elements S3 to SN. Storage element S3 has subsequent storage elements S4 to SN and preceding storage elements S1 and S2.

In more general terms, a storage element S1 has a preceding storage elements S1 to S1−1 and subsequent storage elements S1+1 to SN. The functionality and the content of a storage element S1 is then defined by the value or values stored in one or more of the preceding storage elements S1 to S1−1 and the value or values stored in one or more subsequent storage elements S1+1 to SN.

The storage elements that decide about the mode of operation and the content of the storage element S1 may not be the direct neighbors of S1, but one or more preceding and subsequent storage elements in more distant positions from S1 in the chain. Accordingly the content and operation mode of a storage element S1 may then be defined by the value stored in a preceding storage element S1−K1 and the value stored in a subsequent storage element S1+K2. K1 and K2 can then be positive integers greater than 1.

The individual storage elements S1 to SN are all connected to a common node, which provides the combined output signal D of the control stage DCONT. Furthermore, the input pins ML and FS are also connected together and are the same for all storage elements S1 to SN. The same applies for MH and FL. The input pins INITB are also connected together at node INIT. Signal INIT can be used to initialize all storage elements S1 to SN at once. For storage element S2, the inputs H and L can have four possible values. Either low-low, low-high, high-low or high-high.

In one exemplary embodiment, there are k=4 shared storage capacitors C1, C2, C3 and C4. Instead of providing a storage capacitor in each storage element S1 to SN, the capacitors are shared among the storage elements S1 to SN. Each of the storage capacitors C1 to C4 can be charged and discharged by the storage elements according to a specific order.

For example storage element S3 receives input signal L from storage element S2, signal L2 from storage element S1, signal H from storage element S4 and signal H2 from storage element S5. Signals L2 and H2 control the connection of the storage capacitor C3 to storage element S3. Signals L and H are used for controlling the charging and discharging of the storage capacitor C3 performed by the storage element S3.

In a first scenario, it is assumed for exemplary purposes that there is a continuous UP-signal from the phase frequency detector PFD. In this scenario, the charging of the storage elements starts with storing element S1 and continues consecutively with storage elements S2, S3, S4 up to a storage element S1. Output CC of storage element S1 is coupled to one side of capacitor C1. During initialization (power up) all storage cells S1 to SN are initialized at a voltage level that corresponds to logic level LOW. If the voltage level on storage capacitor C1 reaches a predetermined potential, for example half the supply voltage level (VDD/2), as it is charged through output CC of storage element S1, signal L2 changes from logic level LOW to logic level HIGH for storage element S3 and signal L assumes also a logic level HIGH for storage element S2. In this situation, signal H2 is at logic level LOW for storage element S3 due to the previous power-up sequence. This enables the two internal transmission gates (shown in FIG. 16) of storage element S3 (i.e. the transmission gates are turned on=connecting). The storage capacitor C3 is then connected to the output node OUT (=storage node SNOD) of storage element S3 at output CC.

As previously described, two storage elements are always active while the remainder of the storage elements is not active during the operation of the PLL according to the invention. During initialization, storage element S1 is active and signals L and L2 are connected to supply voltage level VDD. Storage element S2 is then activated and its output CC is coupled to capacitor C2. Capacitor C1 is then charged by storage element S1 and the voltage level at the internal storage node SNOD rises. After charging of the storage node SNOD (which is the output node OUT of the storage cell) of the storage element S2 to the predetermined potential, e.g. half the supply voltage level (VDD/2), signal L of storage element S2 that is coupled to storage element S3, signal L2 of storage element S2 that is coupled to storage element S4 and signal H of storage element S2 that is coupled to storage element S1 are changed to logic level HIGH. This provides that storage element S3 becomes active and storage capacitor C4 is connected to the output node (or storage node SNOD) of storage element S4 through output CC. Storage element S1 is then not active and its output OUT is digitally wired to VDD.

Since the output OUT of storage element S1 is wired to the potential of power source VDD, the storage capacitor C1 becomes available and can be used for example by storage element S5, if this is required. In this situation, storage elements S2 and S3 are active and the remainder of the storage elements is not active. In the next step, storage capacitor C3 is charged through storage element S3. As soon as the output node OUT (or storage node SNOD) of storage element S3 reaches half the supply voltage level (VDD/2) the storage element S4 is activated. The output OUT of storage element S2 is then wired to the supply voltage level VDD and the storage capacitor C1 is connected to the output of the storage element S5. The storage capacitor C1 is charged to supply voltage level VDD through storage element S1. If storage capacitor C1 is then connected to, for example to storage element S5, storage capacitor C1 is discharged to ground (logic LOW), as the output OUT of storage element S5 is digitally wired to logic level LOW. This enables the storage capacitor C1 and makes it available for charging thereby avoiding any voltage glitches at the input of the voltage controlled oscillator VCO. Voltage glitches can occur due to any pre-charge of storage capacitor C1. As soon as the output OUT (output signal CC) of storage element S4 reaches half the supply voltage level (VDD/2) storage element S5 is activated and the output OUT of storage element S3 is wired to the supply voltage level VDD thereby deactivating storage element S3. The storage capacitor C3 is then available. As soon as signal L2 of storage element S5 turns to logic level HIGH (L2 of S5 is coupled to S7), the shared storage capacitor C3 is connected to storage element S7 in order to charge the shared storage capacitor C3. Since two storage elements are always active, a smooth transition from one frequency to higher frequencies can be achieved. This smooth frequency transition prevents any frequency glitches and thereby any undesired jitter of the PLL output.

Considering the exemplary situation of receiving a continuous DOWN signal from the phase frequency detector PFD at the second charge pump CP2, a continuous SLOW pulse (signal LNG) is fed to switching transistors (see transistor N2 shown in FIG. 16) in the storage elements. In this situation, the handover of the shared capacitors C1 to C4 is performed from the most right storage element SN to the most left storage element S1. For example, capacitor C3 is handed over from storage element S7 to storage element S3. Storage capacitor C2 is handed over from storage element S6 to storage element S2. Storage capacitor C1 is handed over from storage element S5 to storage element S1.

In an exemplary scenario, in which for example storage elements S1 to S5 have been charged in response to a previous UP-signal during a PLL locking procedure, it might be further assumed that for example storage elements S5 and S6 are the active storage elements. With a rising edge of the DOWN signal, the storage elements S5 and S6 start discharging their respective shared capacitors C1 and C2. As soon as the output signal INH of storage element S5 reaches half the supply voltage level (VDD/2), signal H2 from storage element S5 that is fed to storage element S3 turns to LOW. Furthermore, signal H from storage element S5 being fed to storage element S4 turns to LOW and signal L from storage element S5 fed to storage element S6 turns to LOW. Accordingly, the output INH of storage element S6 is wired to logic LOW. Since signal H and L are logic HIGH (storage element S3 is at voltage supply level VDD) storage element S4 is activated. Since the signals L2 and R2 are logic HIGH, storage element S3 is connected to shared storage capacitor C3 in order to provide for discharging the capacitor C3. Furthermore, capacitor C2 is decoupled from storage element S6 (digitally wired to logic LOW) and is therefore available for storage element S2, if this is required. The storage capacitor C3 was previously connected to storage element S7, the output INH of which is now wired to logic LOW. Therefore the voltage level across capacitor C3 is also at logic LOW. However, when storage capacitor C3 is connected to storage element S3 and the output INH of storage element S3 is wired to logic HIGH, storage capacitor C3 is charged to the supply voltage level VDD within a very short time. In an embodiment of the invention, this time period for charging the storage capacitor (in this example C3) is very short in order to prepare the storage capacitor C3 for the next storage cell that may be configured to discharge the capacitor. As soon as storage element S3 receives a logic LOW at signal H from storage element S4, storage element S3 is activated and discharges capacitor C3 in order to achieve the required frequency change. Accordingly, a fine tuning of the frequency of the voltage controlled oscillator VCO is achieved through charging and discharging of storage elements using the capacitance sharing principle according to aspects of the invention. Fully charged or discharged storage elements store the digital information of the frequency step of the voltage control oscillator and the active storage element pair provides the required analog fine tuning of the frequency.

Figure 16:
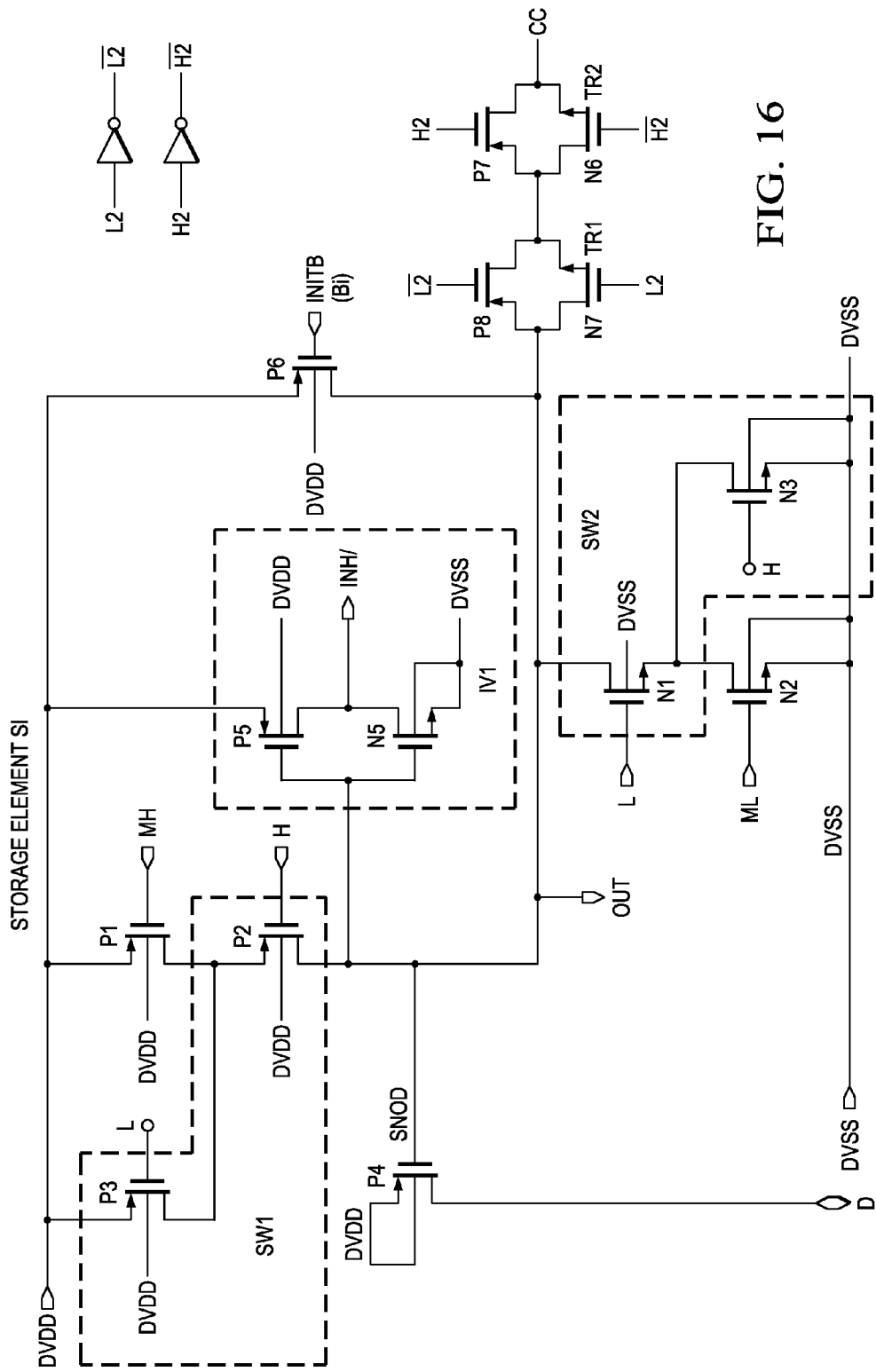
FIG. 16 shows a circuit diagram of the storage element according to another exemplary embodiment of the invention.

The outputs from the storage cells C<1:N> are passed through the SAMPLE block before connecting to the capacitors C1, C2, C3 and C4. The sample block has a set of switches and a high frequency oscillator to enable the charging only for a specific fraction of time. This increases the charging/discharging time of the capacitors and helps to reduce the peaking FIG. 16 shows a storage element as used in FIG. 15 in more detail. The storage node SNOD is coupled to the control gate of a PMOS transistor P4. The source of PMOS transistor P4 is coupled to a supply voltage level DVDD. The drain of PMOS transistor P4 is coupled to the output node D. The storage node SNOD is also coupled to a first switch SW1 and a second switch SW2.

The first switch SW1 is configured to couple the storage node to a first supply voltage level DVDD in response to signals L and H. The second switch SW2 is configured to connect the storage node SNOD to the second supply voltage level DVSS in response to signals L and H. Signals L and H are input signals from the preceding and subsequent storage elements as shown in FIG. 15. The storage node SNOD is also coupled to the gates of PMOS transistor P4 and NMOS transistor N5. PMOS transistor P4 and NMOS transistor N5 form an inverter INV1 which serves to buffer and invert the stored signal on storage node SNOD. The stored content of the storage element S1 is then provided in form of a digital signal at the output signal INH at the output of inverter INV1. In order to initialize the storage element Si, a signal INITB is used and coupled to the control gate of a PMOS transistor P6. If INITB is low, the storage node SNOD is coupled to DVDD and pulled to the first supply voltage level DVDD.

The storage element S1 can be configured in two modes. A first mode may be referred to as analog mode. The second mode may be referred to as digital mode. The storage element S1 is in digital mode, if either switch SW2 or switch SW1 couple the storage node SNOD to the first supply voltage level DVDD or to the second supply voltage level DVSS. Accordingly, the voltage level at node SNOD may be either DVSS or DVDD. This can be considered on out of two different digital values (high and low). However, if neither switch SW1 nor switch SW2 are closed (connecting) the voltage level at the storage node SNOD may be changed in response to signals MH and ML. These signals are received from the second charge pump CP2. If for example input signal H is low (below threshold voltage level of transistor P2) and signal MH is also low, a current can flow from DVDD to the storage node SNOD. If however signal L is high, then a current can flow from storage node SNOD to the second supply voltage level DVSS if signal ML is also above the threshold voltage level of N2.

A signal H is received from the subsequent storage element S1+1. A signal L is received from the preceding storage element S1−1. As shown in this figure, the signal INH is the inverted stored signal at storage node SNOD. If signals H and L are both at low level (below the threshold values of the respective transistors to which they are coupled) PMOS transistor P2 and PMOS transistor P3 are enabled and NMOS transistor N1 and NMOS transistor N3 are disabled. Accordingly, capacitor terminal OUT is pulled to the high voltage level DVDD. If H and L are both at high level (above or below the respective threshold voltage levels of the transistors), the capacitor terminal OUT or the storage node SNOD is pulled to the second supply voltage level DVSS. As soon as the voltage at the storage node SNOD exceeds the threshold level of the inverter INV1 formed with PMOS transistor P5 and NMOS transistor N5, the level at the node INH changes from high to low or low to high depending on whether the voltage at the storage node SNOD increases or decreases.

The shared capacitors (for example C1 to C4 as shown in FIG. 15) can selectively be coupled to the storing node SNOD (=OUT) through transmission gates. There are two transmission gates TR1 and TR2 coupled in series between the storage node SNOD and output node CC.

If signals H and L are both low, the shared capacitor is pulled to high voltage level. If signals H and L are low and high, the shared capacitor keeps its voltage. If signals H and L are at high level, the capacitor voltage is pulled down to low level. At the beginning (power-up, initialization), all storage elements S1 to SN are initialized to high level. This means that the PMOS transistor P6 which is coupled to the storage node SNOD does not supply any current.

Accordingly, the controlled oscillator VCO does not receive any current from the delay control stage DCONT. Therefore, the controlled oscillator VCO oscillates at the lowest oscillation frequency. In order to comply with the required frequency and phase of the reference input clock REFCLK, the phase frequency detector PFD and subsequently the charge pump CP2 issue signals in order to increase the frequency of the controlled oscillator VCO.

The phase frequency detector generates UP pulses at the output node. In response to these UP pulses, the second charge pump CP2 generates a reference voltage at node SHN. This node SHN is connected to input FS of the delay control stage.

The storage element S1 is connected to ML and tries to discharge the storage node and thereby the shared capacitor (not shown). Storage elements S2 to SN have both terminals H and L at low level. Therefore, the respective storage capacitors as far as coupled to any of storage elements S2 to SN are pulled high through transistors P2 and P3. However, as soon as the stored signal at storage node SNOD of storage element Si falls below the threshold voltage of inverter INV1 (the threshold voltage level of inverter INV1 may be at half the first supply voltage level DVDD (DVDD/2)), the signal INH of storage element S1 changes from low to high. This change from low to high of signal INH of storage element S1 disables that storage node SNOD in storage element S2 is pulled to the first voltage level (high) as transistor P3 is turned off. As a consequence, the two shared capacitors that may be coupled to CC of storage elements S1 and S2 are affected by the up and down pulses (signals UP and DN) issued by the phase frequency detector PFD. As soon as the voltage level at node SNOD in storage element S2 exceeds the threshold voltage level of the inverter INV1 of storage element S2, storage element S3 is activated. As soon as storage element S3 is activated, the input signal H of storage element S1 receives a high voltage level and transistors N1 and N3 of storage element S1 are activated. The voltage level at storage node SNOD is now pulled down to the second supply voltage level DVSS (ground). This means that always two storage elements are active for analog tuning and all other storage elements are in digital mode, which means they are high or low in response to the values of their neighbors.

The two transmission gates TR1, TR2 comprise respective PMOS and NMOS transistors P7, P8, N6 and N7 which are controlled through signals L2 and H2. The transmission gates TR1, TR2 are used to couple and decouple the output node to and from node CC (and thereby to and from storage node SNOD) to respective shared capacitors. In particular, if a storage element is not active and not close to the active storage elements, the output OUT/storage node SNOD should be decoupled from the respective capacitor in order to make it possible that other storage elements use the shared capacitor. The control signals L2 and H2 are received from storage elements which are not the direct neighbors but neighbors next to the direct neighbors to the right and to the left of the storage elements (second neighbors). In order to control the transmission gates, the complementary signals of H2 and L2 are generated by inverters INV as shown on the right top of FIG. 16.

Figure 17:
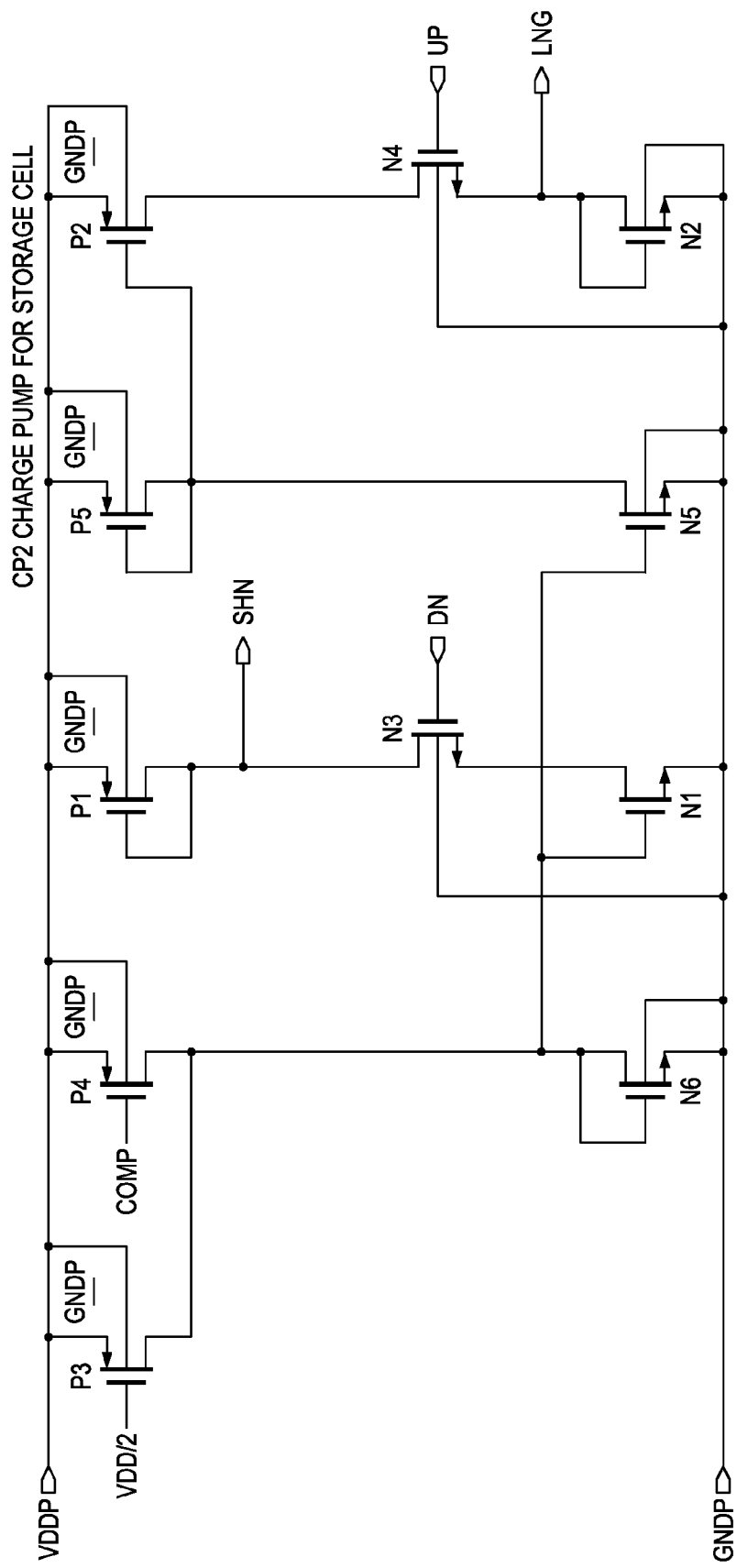
FIG. 17 shows a circuit diagram of the charge pump used for the storage element according to another exemplary embodiment of the invention.

FIG. 17 shows a circuit diagram of charge pump CP2 according to an exemplary embodiment of the invention. The charge pump CP2 could be for example used in the PLL 2 of FIG. 13. PMOS transistor P3 is biased using a fixed DC voltage, which could be for example one half of the positive supply voltage (VDD/2). This generates a nominal current for the charge pump. Transistor P4 is controlled by the compensation signal COMP produced by the controlled oscillator VCO as described in connection with FIG. 14 above. Compensation voltage COMP has information for process compensation. The current through transistor P4 changes in proportion to the current consumed by controlled oscillator VCO. For example, when the device is in weak PVT corner, the current through transistor P3 decreases, but as the controlled oscillator VCO takes more current to oscillate at the target frequency, current through P4 increases in proportion to current consumed by controlled oscillator VCO. Similarly, when the device operates in strong PVT conditions, the current through transistor P3 increases. At the same time, the current through transistor P4 decreases as the current consumed by controlled oscillator VCO is less. Current flowing through transistor N6 will be the sum of currents through transistors P3 and P4. The sizes of transistors P3 and P4 can be adjusted such that the variation in current through transistor N6 is minimal across various process corners. Current through transistor N6 is copied to other branches in the circuit (through transistors N1 and N5) to generate the compensated charge pump current.

Figure 18:
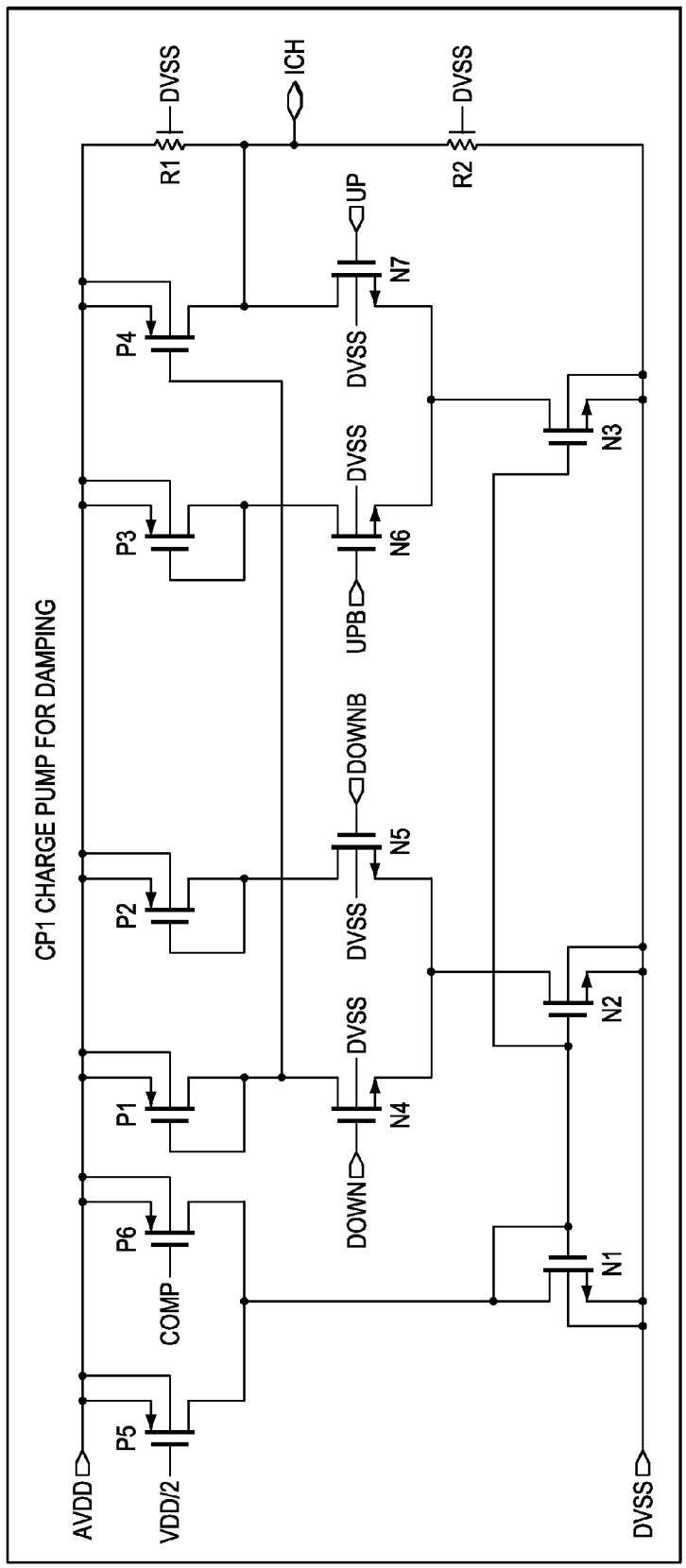
FIG. 18 shows a circuit diagram of charge pump for damping according to an exemplary embodiment of the invention.

FIG. 18 shows the circuit diagram of CP1 charge pump CP1 according to an exemplary embodiment of the invention. The charge pump CP1 could be for example used in the PLL 2 of FIG. 13. In charge pump CP1 the charge pump current is generated similar to the charge pump current of charge pump CP2, as described with respect to FIG. 17 above. In the circuit, PMOS transistor P5 is biased using a fixed DC voltage, which is again set to one half of the positive power supply potential (VDD/2). Transistor P5 generates a nominal current for the charge pump. Transistor P6 is controlled by the compensation signal COMP produced by the controlled oscillator VCO, as shown in FIG. 14. Compensation signal COMP includes information for process compensation. The current through transistor P6 changes in proportion to the current consumed by controlled oscillator VCO. For example, when the device is in weak PVT corner, the current through transistor P5 decreases, but as the controlled oscillator VCO takes more current to oscillate at the target frequency, current through transistor P6 increases in proportion to current consumed by controlled oscillator VCO. Similarly, when the device operates in strong PVT conditions, the current through transistor P5 increases. At the same time, the current through transistor P6 decreases as the current consumed by controlled oscillator VCO is less. Current flowing through transistor N1 will be the sum of currents through transistors P5 and P6. The sizes of transistors P5 and P6 can be adjusted such that the variation in current through transistor N1 is minimal across various process corners. Current through transistor N1 is copied to other branches in the circuit (through transistors N2 and N3) to generate the compensated charge pump current.

Figure 19:
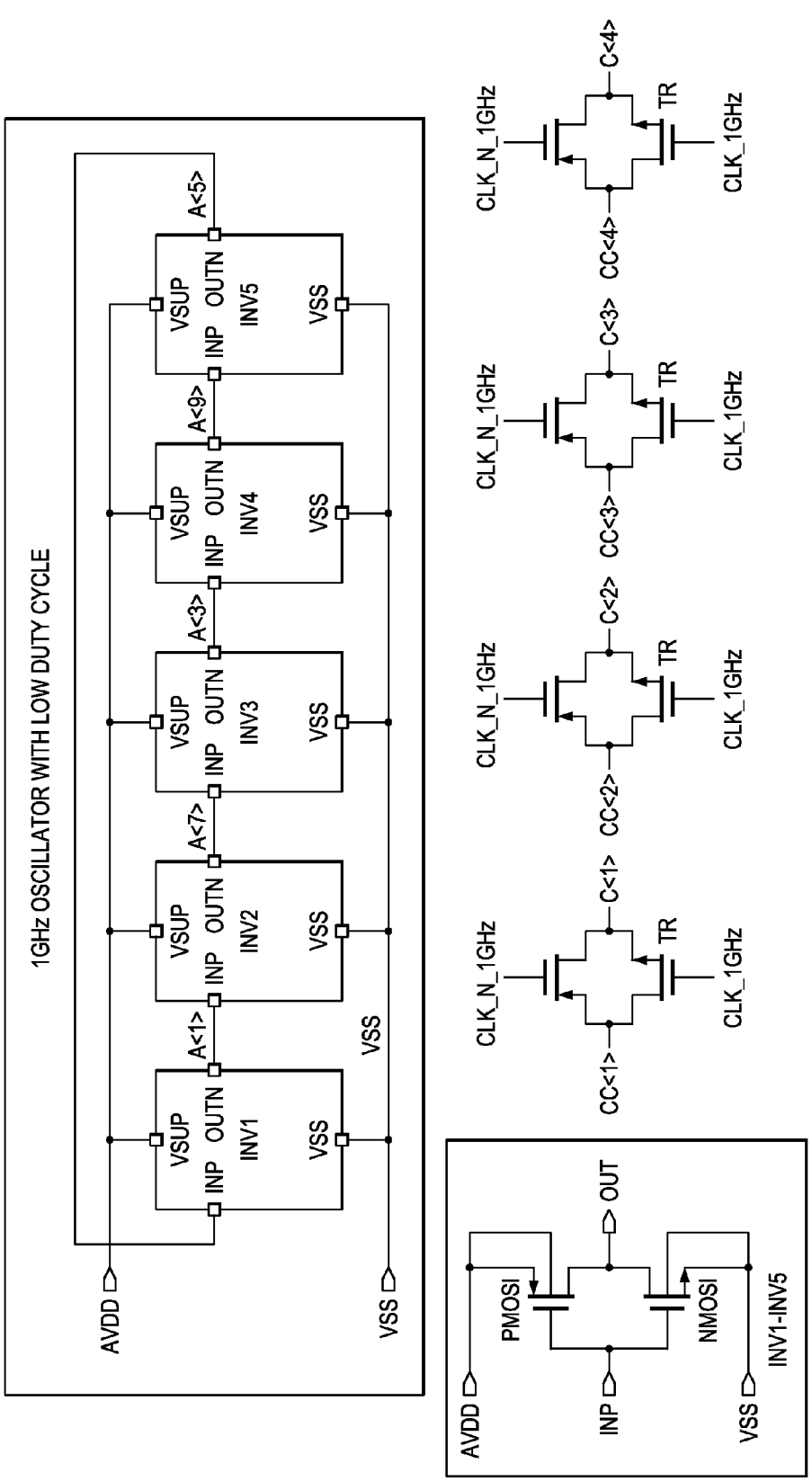
FIG. 19 shows a circuit diagram of sample module used to reduce frequency peaking according to an exemplary embodiment of the invention.

As noted above, it is another aspect of the invention to provide a phase locked loop that has lower peaking in its frequency response, which results in better settling response. The frequency response peaking may be for example lowered by reducing the integral path gain of the phase locked loop, e.g. by reducing the duty cycle by means of a high frequency clock signal with a low duty cycle. The duty cycle of the clock may be for example set to be less than 25% such that the storage capacitor is allowed to charge or discharge only 25% of the time. FIG. 19 shows the circuit diagram of SAMPLE module according to an exemplary embodiment of the invention that allows providing a clock signal in the 1 GHz range with a low duty cycle. The clock signal is generated by an oscillator. The oscillator consists of 5 inverter stages in this example. The oscillator is designed such that the frequency of oscillation is 1 GHz at nominal conditions. The signals A<1> and A<3> are connected to an OR gate to generate the high frequency clock with a reduced duty cycle, in this example less than 25%. The output of the OR gate is passed through an inverter to generate signal CLK__1 GHz and through a buffer to generate signal CLK_N__1 GHz. These clock signals have a frequency of 1 GHz and are used to enable the charging of the storage capacitors. The signals CC<1:4> pass through high frequency switches (transmission gates) controlled by these clock signals. The PMOS transistor of the switches is controlled by clock signal CLK_N__1 GHz and the NMOS transistor in the switches is controlled by clock signal CLK__1 GHz. As the duty cycle of the clock is less than 25%, the charging/discharging of the capacitors take place only 25% of the time effectively increasing the charging/discharging time by factor of 4. This reduces the peaking of the frequency response and provides a better settling response.

In one example, the charge pump CP2 may receive the clock signal clock signal CLK__1 GHz and/or clock signal CLK_N__1 GHz and essentially "multiplies" the storage control signals SHN and LNG with one of the clock signals to reduce their duty cycle. Alternatively, this operation may also be performed in the control stage DCONT.

In an alternative implementation, instead of using a high speed clock signal to reduce the duty cycle, circuitry is implemented in either charge pump CP2 or control stage DCONT that decreases the pulse width of the storage control signals SHN and LNG by a given factor to obtain the desired duty cycle. For example, this circuitry could convert the storage control signals SHN and LNG such that they have only 1/N of the width of the UP and DOWN pulses received from the phase frequency detector PFD, where 1/N is the desired duty cycle.

Figure 20:
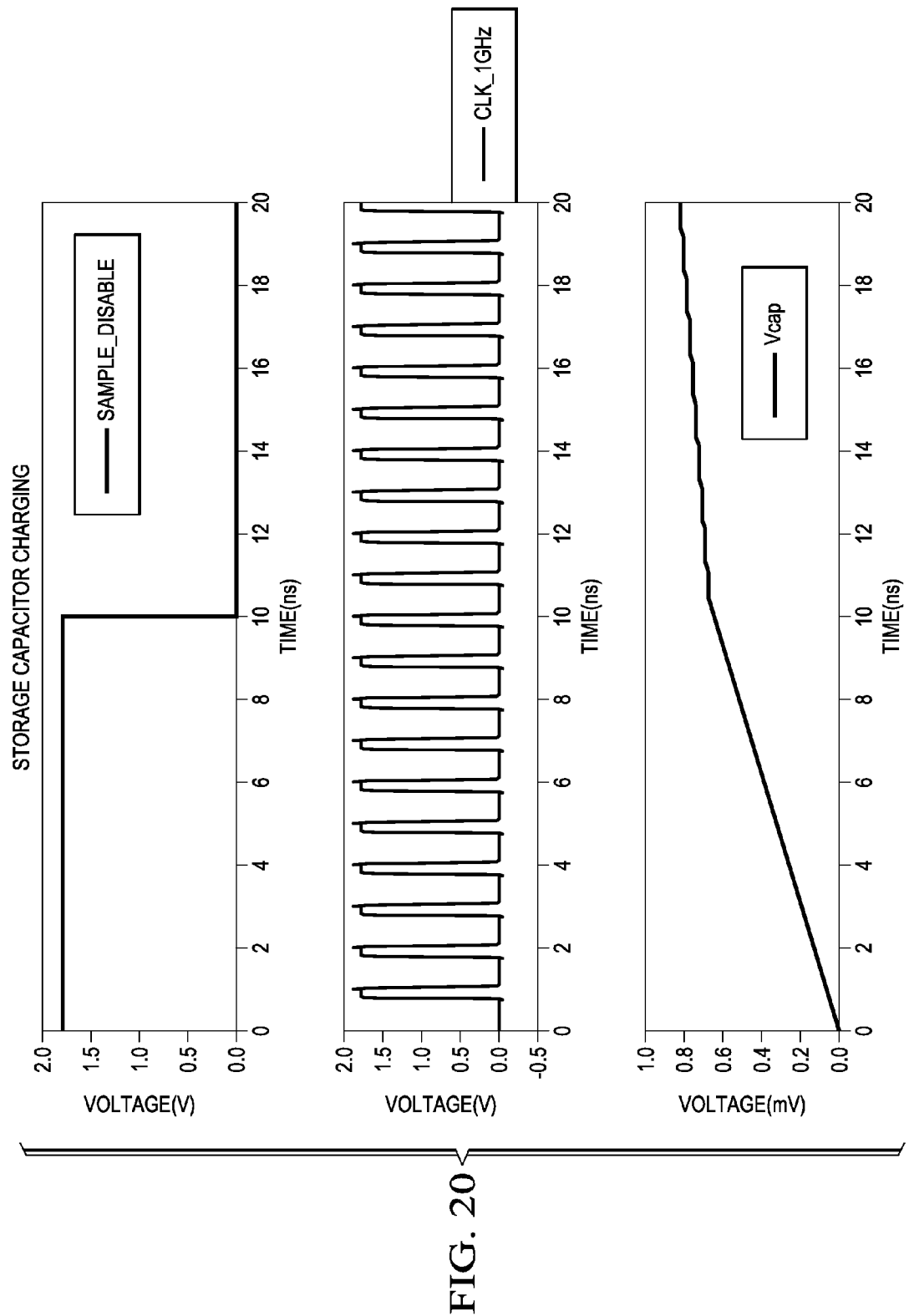
FIG. 20 shows waveform of capacitors charging with and without sampling according to an exemplary embodiment of the invention.

FIG. 20 shows the waveforms illustrating the effect of sampling on the charging time of the capacitor. The first signal is the sample disable signal which disables the sampling of the integral path. The second signal is the 1 GHz clock with 25% duty cycle. Third signal is the voltage across the storage capacitor. When the sample disable signal is logic high, the capacitor charges at a particular rate with the sampling logic being disabled and the charging happening at 100% of the time. With sample disable signal low, the capacitor charges only 25% of the time. This slows down the charging of the capacitor and hence increases the time required to charge the capacitor. As the charging event is linear, this increases the charging time by the same factor as the duty cycle. In this example the charging time increases by a factor of 4.

Figure 21:
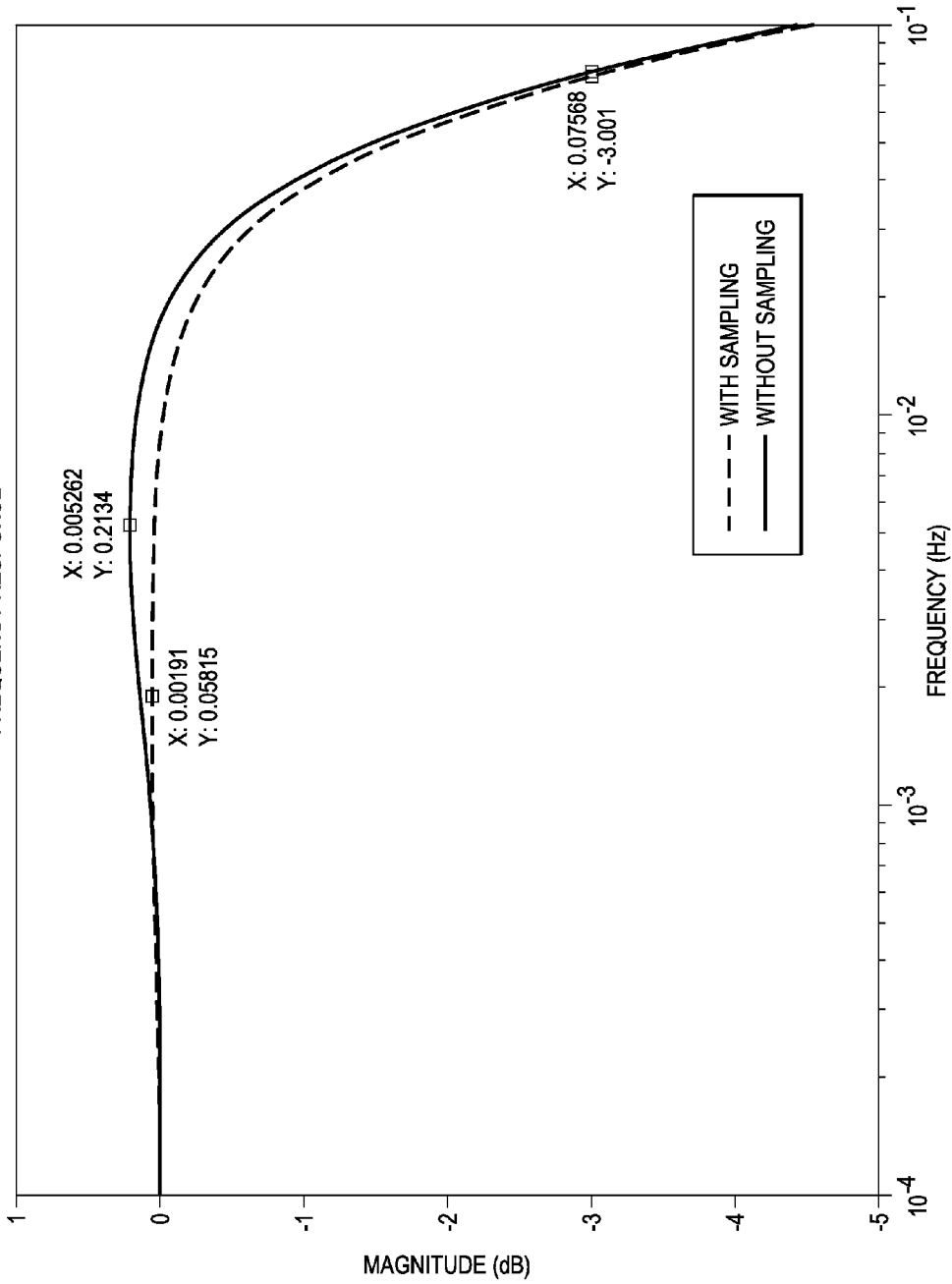
FIG. 21 shows waveform illustrating the effect of reduced peaking according to an exemplary embodiment of the invention.

FIG. 21 shows waveforms exemplarily illustrating effect of sampling on the frequency domain peaking of the phase locked loop with a 1 GHz clock signal having a duty cycle of 25%. The curve with thick lines shows the frequency response while allowing the capacitor to charge during 100% of the time. The peaking in this case can be seen as 0.2134 dB. The second curve in dotted lines shows the frequency response by introducing the sampling. In this case the peaking can be seen to be reduced to 0.05815 dB. This effects a reduction of peaking by 0.155 dB.

Figure 22:
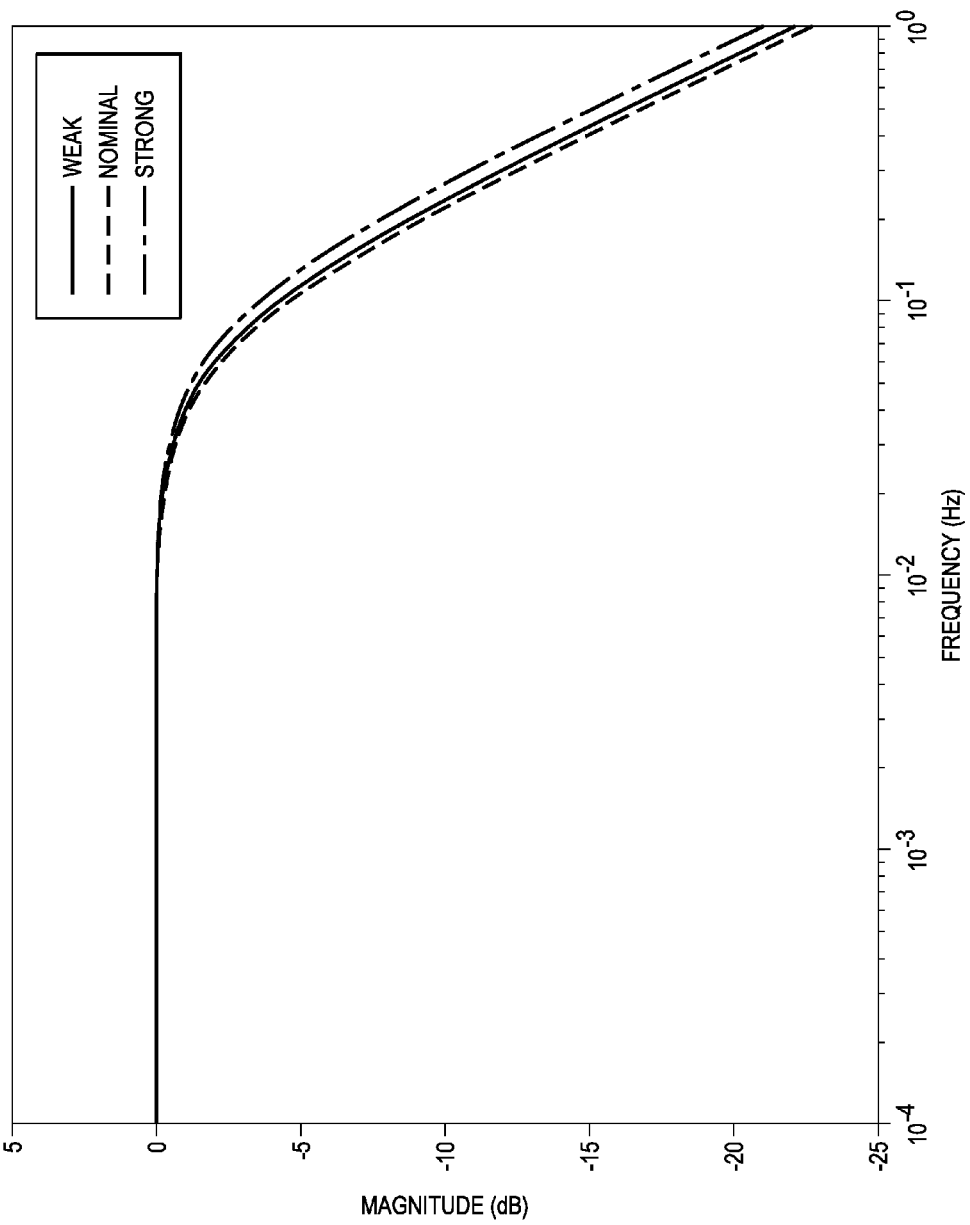
FIG. 22 shows waveform illustrating the effect of process compensation according to an exemplary embodiment of the invention.

FIG. 22 shows waveforms exemplarily illustrating the effect of process compensation on the frequency response of the phase locked loop base using the compensation signal COMP as outlined with respect to FIGS. 13 to 18 above. Three waveforms are shown for various operating conditions of Process, Voltage and Temperature. The curves for all three conditions do not vary a lot, giving similar peaking and bandwidth. Hence the loop dynamics of the phase lock loop remains within reasonable limits with variations in process voltage and temperature.

Having thus described the invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the invention may be employed without a corresponding use of the other features. Accordingly, it is appropriate that the appended claims be construed broadly and in a manner consistent with the scope of the invention.

The invention claimed is:

1. A phase locked loop (PLL) comprising:
a phase frequency detector (PFD) adapted to receive a feedback clock (SYSCLK) and a reference clock (REFCLK) and adapted to provide UP pulses and DOWN pulses for controlling the oscillation frequency of a controlled oscillator (VCO) in response to a phase and/or frequency difference between the feedback clock and the reference clock;
a first charge pump (CP1) adapted to receive the UP pulses and DOWN pulses from the phase frequency detector (PFD), wherein the first charge pump (CP1) is further adapted to provide a first analog control signal to a first control input (PROP) of the controlled oscillator (VCO) to control its oscillation frequency in response to the UP pulses and DOWN pulses from the phase frequency detector (PFD),
a second charge pump (CP2) adapted to receive the UP pulses and DOWN pulses from the phase frequency detector (PFD), wherein the second charge pump (CP2) is further adapted to provide a first analog storage control signal (FAST) and a second analog storage control signal (SLOW) corresponding to the UP pulses and DOWN pulses from the phase frequency detector (PFD) to a control stage (DCONT);
said control stage (DCONT) adapted to provide a second analog control signal (D) to a second control input (VSUP) of the controlled oscillator (VCO) to control its oscillation frequency in response to the first analog storage control signal (FAST) and a second analog storage control signal (SLOW);
said controlled oscillator (VCO) adapted to output an output signal (OUTVCO) with a desired oscillation frequency in response to the first analog control signal (ICH) received at the first control input (PROP) and the second analog control signal (D) to the second control input (VSUP); and
a feedback loop adapted to feedback the output signal (OUTVCO) of the controlled oscillator (VCO) to the input of the phase frequency detector (PFD) as said feedback clock (SYSCLOCK);
wherein the control stage (DCONT) comprises a plurality of storage elements (S1, S2), a counter, and a digital-to-analog converter (DAC);
wherein the control stage (DCONT) is adapted to continuously charge and reset, or discharge and reset each of the storage elements in respective cycles and in response to the first analog storage control signal (FAST) and a second analog storage control signal (SLOW), respectively;
wherein the counter is adapted to increase or decrease its counter value in response to the number of charging cycles or discharging cycles performed by the storage elements (S1, S2), respectively;
wherein the digital-to-analog converter (DAC) is adapted to convert the counter value of the counter to a control current; and
wherein the control stage (DCONT) is adapted to provide the control current of the digital-to-analog converter superimposed with currents representing the respective charging/discharging state of the respective storage elements as the second analog control signal (D) to the second control input (VSUP) to the controlled oscillator (VCO).

2. The phase locked loop of claim 1, wherein the control stage (DCONT) comprises two storage elements (S1, S2).

3. The phase locked loop of claim 1, wherein each of the storage elements (S1, S2) comprises a capacitor (Cs1, Cs2), that is charged or discharged in response to the first analog storage control signal (FAST) and a second analog storage control signal (SLOW), respectively.

4. The phase locked loop of claim 3, wherein the current representing the respective charging/discharging state of a respective one of the storage elements is representative of the current stored on the respective capacitor (Cs1, Cs2) of the storage element.

5. The phase locked loop according to claim 4, wherein the each of the storage elements (S1, S2) is adapted to provide an output signal (OUT) as an input signal (IN) to the respective other storage element (S2, S1), wherein asserting the output signal (OUT) by one of the storage elements causes another storage element receiving the output signal (OUT) as the input signal (IN) to start charging, respectively discharging its capacitor (Cs1, Cs2).

6. The phase locked loop according to claim 5, wherein there is a low potential threshold level, a high potential threshold level and mid potential threshold level between the low potential threshold level and the high potential threshold level.

7. The phase locked loop according to claim 6, wherein a storage element is adapted to assert the output signal (OUT) when its capacitor is charged or discharged to the mid potential threshold level.

8. The phase locked loop according to claim 7, wherein a storage element is adapted to reset the voltage across its capacitor (Cs1, Cs2) to the low potential threshold level and to output a count-up clock pulse to the counter, when its capacitor is charged to the high potential threshold level, wherein the counter is adapted to increase the counter value in response to the count-up clock pulse (CLK_UP).

9. The phase locked loop according to claim 8, wherein a storage element is adapted to reset the voltage across its capacitor (Cs1, Cs2) to the high potential threshold level and to output a count-down clock pulse to the counter, when its capacitor is charged to the low potential threshold level, wherein the counter is adapted to decrease the counter value in response to the count-down clock pulse (CLK_DOWN).

10. The phase locked loop according to claim 9, wherein the low potential threshold level is equal to ¼ of a predetermined potential (VDD), the high potential threshold level ¾ of the predetermined potential and the mid potential threshold level is equal to ½ of the predetermined potential.

11. The phase locked loop of claim 10, wherein the second charge pump (CP2) is adapted to produce the first analog storage control signal (FAST) and a second analog storage control signal (SLOW) from the UP pulses and DOWN pulses.

12. The phase locked loop according to claim 11, wherein the second charge pump is adapted to produce the first analog storage control signal and a second analog storage control signal by lowering the duty cycle of the UP pulses and DOWN pulses to 25% or lower.

13. The phase locked loop according to claim 12, wherein the signal level of the UP pulses and DOWN pulses is equal to a predetermined potential (VDD), and the second charge pump is adapted to produce the first analog storage control signal and a second analog storage control signal by reducing the signal level of the UP pulses and DOWN pulses.

14. The phase locked loop according to claim 13, wherein the first charge pump (CP1) and/or the second charge pump (CP2) are adapted to receive the output signal (OUTVCO) of the controlled oscillator (VCO) and to use the same for process-voltage-temperature (PVT) compensation.

15. A phase locked loop (PLL) comprising:
a phase frequency detector (PFD) adapted to receive a feedback clock (SYSCLK) and a reference clock (REFCLK) and adapted to provide UP pulses and DOWN pulses for controlling the oscillation frequency of a controlled oscillator (VCO) in response to a phase and/or frequency difference between the feedback clock and the reference clock;
a first charge pump (CP1) adapted to receive the UP pulses and DOWN pulses from the phase frequency detector (PFD), wherein the first charge pump (CP1) is further adapted to provide a first analog control signal (ICH) to a first control input (PROP) of a controlled oscillator (VCO) to control its oscillation frequency in response to the UP pulses and DOWN pulses from the phase frequency detector (PFD),
a second charge pump (CP2) adapted to receive the UP pulses and DOWN pulses from the phase frequency detector (PFD), wherein the second charge pump (CP2) is further adapted to provides a first analog storage control signal (FAST) and a second analog storage control signal (SLOW) corresponding to the UP pulses and DOWN pulses from the phase frequency detector (PFD) to a control stage (DCONT);
said control stage (DCONT) adapted to provide a second analog control signal (D) to a second control input (VSUP) of the controlled oscillator (VCO) to control its oscillation frequency in response to the first analog storage control signal (FAST) and a second analog storage control signal (SLOW);
said controlled oscillator (VCO) adapted to output an output signal (OUTVCO) with a desired oscillation frequency in response to the first analog control signal (ICH) received at the first control input (PROP) and the second analog control signal (D) to the second control input (VSUP); and
a feedback loop adapted to feedback the output signal (OUTVCO) of the controlled oscillator (VCO) to the input of the phase frequency detector (PFD) as said feedback clock (SYSCLOCK),
wherein first charge pump (CP1) and/or the second charge pump (CP2) are adapted to receive the output signal (OUTVCO) of the controlled oscillator (VCO) and to use the same for process-voltage-temperature (PVT) compensation,
wherein the first charge pump (CP1) is adapted to increase or decrease the amount of current provided by the first analog control signal (ICH) in response to the output signal (OUTVCO) of the controlled oscillator (VCO).

16. The phase locked loop according to claim 15, wherein the second charge pump (CP2) is adapted to increase or decrease the amount of current provided by the first analog storage control signal (FAST) and the second analog storage control signal (SLOW), respectively, in response to the output signal (OUTVCO) of the controlled oscillator (VCO).

17. An integrated circuit comprising a phase locked loop (PLL) according to claim 16.

18. An electronic device comprising a phase locked loop (PLL) according to claim 16.

19. A method for operating a phase locked loop (PLL) comprising:
receiving a feedback clock (SYSCLK) and a reference clock (REFCLK) at a phase frequency detector (PFD);
providing UP pulses and DOWN pulses for controlling the oscillation frequency of a controlled oscillator (VCO) in response to a phase and/or frequency difference between the feedback clock and the reference clock;
receiving the UP pulses and DOWN pulses at a first charge pump (CP1);
providing a first analog control signal (ICH) from the first charge pump (CP1) to a first control input (PROP) of a controlled oscillator (VCO) to control its oscillation frequency;
receiving the UP pulses and DOWN pulses at a second charge pump (CP2);
providing a first analog storage control signal (FAST) and a second analog storage control signal (SLOW) corresponding to the UP pulses and DOWN pulses to a control stage (DCONT);
providing by said control stage (DCONT) a second analog control signal (D) to a second control input (VSUP) of the controlled oscillator (VCO) to control its oscillation frequency in response to the first analog storage control signal (FAST) and a second analog storage control signal (SLOW);
outputting, by said controlled oscillator (VCO), an output signal (OUTVCO) with a desired oscillation frequency in response to the first analog control signal (ICH) and the second analog control signal (D) to the second control input (VSUP); and continuously charging and resetting, or discharging and resetting, storage elements (S1, S2) of the control stage in respective cycles and in response to the first analog storage control signal (FAST) and a second analog storage control signal (SLOW), respectively;

increasing or decreasing a counter value of a digital counter in response to the number of charging cycles or discharging cycles performed by the storage elements (S1, S2), respectively;

convert the digital counter value of the counter to a control current;

superimposing the control current with currents representing the respective charging/discharging state of the respective two storage elements; and providing the superimposed current as the second analog control signal (D) to the second control input (VSUP) to the controlled oscillator (VCO).

20. A method for operating a phase locked loop (PLL) comprising:

receiving a feedback clock (SYSCLK) and a reference clock (REFCLK) at a phase frequency detector (PFD);

providing UP pulses and DOWN pulses for controlling the oscillation frequency of a controlled oscillator (VCO) in response to a phase and/or frequency difference between the feedback clock and the reference clock;

receiving the UP pulses and DOWN pulses at a first charge pump (CP1);

providing a first analog control signal (ICH) from the first charge pump (CP1) to a first control input (PROP) of a controlled oscillator (VCO) to control its oscillation frequency;

receiving the UP pulses and DOWN pulses at a second charge pump (CP2);

providing a first analog storage control signal (FAST) and a second analog storage control signal (SLOW) corresponding to the UP pulses and DOWN pulses to a control stage (DCONT);

providing by said control stage (DCONT) a second analog control signal (D) to a second control input (VSUP) of the controlled oscillator (VCO) to control its oscillation frequency in response to the first analog storage control signal (FAST) and a second analog storage control signal (SLOW);

outputting, by said controlled oscillator (VCO), an output signal (OUTVCO) with a desired oscillation frequency in response to the first analog control signal and the second analog control signal (D) to the second control input (VSUP);

receiving the output signal (OUTVCO) of the controlled oscillator (VCO) at the first charge pump (CP1) and/or the second charge pump (CP2) and using the output signal (OUTVCO) of the controlled oscillator (VCO) for process-voltage-temperature (PVT) compensation, wherein the first charge pump (CP1) is adapted to increase or decrease the amount of current provided by the first analog control signal (ICH) in response to the output signal (OUTVCO) of the controlled oscillator (VCO).

\* \* \* \* \*